United States Patent
Verspecht et al.

(10) Patent No.: US 10,845,401 B2
(45) Date of Patent: Nov. 24, 2020

(54) NONLINEAR DISTORTION DETECTION

(71) Applicant: Keysight Technologies, Inc., Santa Rosa, CA (US)

(72) Inventors: Jan Verspecht, Londerzeel (BE); Keith F. Anderson, Santa Rosa, CA (US); Joel P. Dunsmore, Sebastopol, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 400 days.

(21) Appl. No.: 15/690,934

(22) Filed: Aug. 30, 2017

(65) Prior Publication Data

US 2019/0064236 A1 Feb. 28, 2019

(51) Int. Cl.
| | | |
|---|---|---|
| *G01R 23/163* | (2006.01) | |
| *G01R 23/20* | (2006.01) | |
| *G01R 27/28* | (2006.01) | |
| *H04B 17/00* | (2015.01) | |
| *H04B 17/29* | (2015.01) | |
| *H04L 27/26* | (2006.01) | |

(52) U.S. Cl.
CPC ........... *G01R 23/20* (2013.01); *G01R 23/163* (2013.01); *G01R 27/28* (2013.01); *H04B 17/0085* (2013.01); *H04B 17/29* (2015.01); *H04L 27/2628* (2013.01)

(58) Field of Classification Search
CPC ...... G01R 23/20; G01R 23/163; G01R 27/28; H04B 17/29; H04B 17/0085; H04L 27/2628
See application file for complete search history.

(56) References Cited

U.S. PATENT DOCUMENTS

| | | | | |
|---|---|---|---|---|
| 2003/0228856 A1* | 12/2003 | Orihashi | ............... | H03F 1/3247 455/226.1 |
| 2004/0156430 A1* | 8/2004 | Lobo | .................. | G01R 31/2822 375/224 |
| 2008/0139141 A1* | 6/2008 | Varghese | ............... | H03F 1/3294 455/114.3 |
| 2011/0302230 A1* | 12/2011 | Ekstrand | ................. | H04S 7/307 708/201 |
| 2015/0043626 A1* | 2/2015 | Williams | ............... | H04W 24/08 375/227 |
| 2016/0191020 A1* | 6/2016 | Velazquez | .......... | H03H 21/0067 341/118 |
| 2017/0163350 A1* | 6/2017 | Chien | ................ | H04B 10/6162 |

* cited by examiner

*Primary Examiner* — Mohamed Charioui
*Assistant Examiner* — Christine Y Liao

(57) ABSTRACT

Nonlinear distortion of a device under test (DUT) is detected by obtaining measurements of a multi-tone input signal from a signal generator to a DUT, to obtain a measured multi-tone input signal. Measurements are also obtained of a multi-tone output signal from the DUT that is generated based on the multi-tone input signal, to obtain a measured multi-tone output signal. A correlated part of the measured multi-tone output signal that is correlated with the measured multi-tone input signal is determined insofar as the correlated part corresponds to a frequency response function of the DUT.

16 Claims, 17 Drawing Sheets

NONLINEAR DISTORTION DETECTION

BACKGROUND

A wireless signal is typically distorted upon generation by a signal generator. Signal generators include semiconductor components that add noise to a wireless signal resulting in distortion to the wireless signals with nonlinear effects known as nonlinear distortion. On the signal reception end, this nonlinear distortion will degrade the bit-error-ratio (BER). As a signal receiver, a device under test (DUT) receives a wireless input signal $X(\omega)$ from a signal generator as excitation input, and the relationship between the spectrum of the input signal $X(\omega)$ to the DUT and the spectrum of the output signal $Y(\omega)$ from the DUT is given by equation (1):

$$Y(\omega) = H(\omega)X(\omega) + E(\omega) \quad (1)$$

In equation (1), ($\omega$) is the frequency of the signal. $H(\omega)$ represents a complex frequency response function of the DUT that establishes the relationship between the input signal $X(\omega)$ and the output signal $Y(\omega)$. The complex frequency response function $H(\omega)$ provides a measure of the magnitude and phase of the output signal $Y(\omega)$ compared to the input signal $X(\omega)$. $E(\omega)$ represents the nonlinear distortion. Equation (1) is simplified by assumptions described below.

Power spectral density (PSD) describes power in a signal as a function of frequency. Graphs of power spectral density evidence characteristics of signals including the effects of nonlinear distortion. Such graphs are used extensively herein for illustrations. The frequency response function $H(\omega)$ and the power spectral density of $E(\omega)$ are uniquely determined by the power spectral density of input signal $X(\omega)$ and by the cumulative distribution function of the amplitude of the corresponding complex envelope $X(t)$ of the input signal $X(\omega)$. The envelope of the input signal $X(\omega)$ outlines upper and/or lower extremes of waves of input signal $X(\omega)$. The complex envelope $X(t)$ includes both amplitude and phase for input signal $X(\omega)$. The complex envelope $X(t)$ is given by equation (2):

$$x(t) = \text{InverseFourier}[X(\omega)] \quad (2)$$

As an explanation of equation (2), Fourier transforms decompose a signal as a function of time into the frequencies that make up the signal to produce a representation of the original signal in the frequency domain. The inverse Fourier transform in equation (2) reverses a Fourier transform by combining contributions of all the different frequencies to recover the original signal as a function of time.

A conventional method for measuring nonlinear distortion $E(\omega)$ uses a noise-power-ratio (NPR) or an adjacent channel power ratio (ACPR). In both, power of input signal $X(\omega)$ is nulled to zero at frequencies in a band called the "notch" where $E(\omega)$ is to be determined, so that nonlinear distortion $E(\omega)$ can be measured directly. Because the input signal $X(\omega)$ equals zero (0) in the notch, the output power spectral density in the notch is the power spectral density of $E(\omega)$. Noise-power-ratio is the ratio between power spectral density of the output signal adjacent to the notch and power spectral density of the output signal in the notch. Adjacent channel power ratio is the ratio between the noise power of the output signal adjacent to the notch and the total power present in the input channel.

Another method for measuring nonlinear distortion $E(\omega)$ is to determine error-vector-magnitude. A signal is generated according to a particular modulation standard, and the complex envelope corresponding to the output signal $Y(\omega)$ is then measured. The complex envelope is demodulated by dedicated software, which results in knowledge of $X(\omega)$ and, for modern communication standards like "Long Term Evolution" (LTE), also $H(\omega)$. When $H(\omega)$ cannot be determined by referring to the communications standard, it is assumed that $H(\omega)$ simply corresponds to a constant complex gain and a delay. $E((\omega)$ is then calculated by removing the derived spectrum $X(\omega)H(\omega)$ from $Y(\omega)$.

In the methods described above, power spectral density of $E(\omega)$ is measured by assuming a perfect input signal $X(\omega)$, and in some instances by relying on a communications standard for $H(\omega)$ or assuming that $H(\omega)$ simply corresponds to a constant complex gain and a delay. However, as noted from the beginning, signal generators that generate the input signal $X(\omega)$ are built using semiconductor components that introduce nonlinear distortions of the same kind as the nonlinear distortions of the DUT. The nonlinear distortions from the signal generator can fill the notch. Additionally, it is difficult or almost impossible to build a signal generator that can provide both the necessary output power as well as a notch that is deep enough to characterize the nonlinear distortion of a state-of-the-art DUT. Test equipment such as a spectrum analyzer cannot distinguish between the nonlinear distortion present in the input signal itself and the nonlinear distortion caused by the DUT. As a result, much effort goes into building signal generators that have as little nonlinear distortion as possible.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1A:
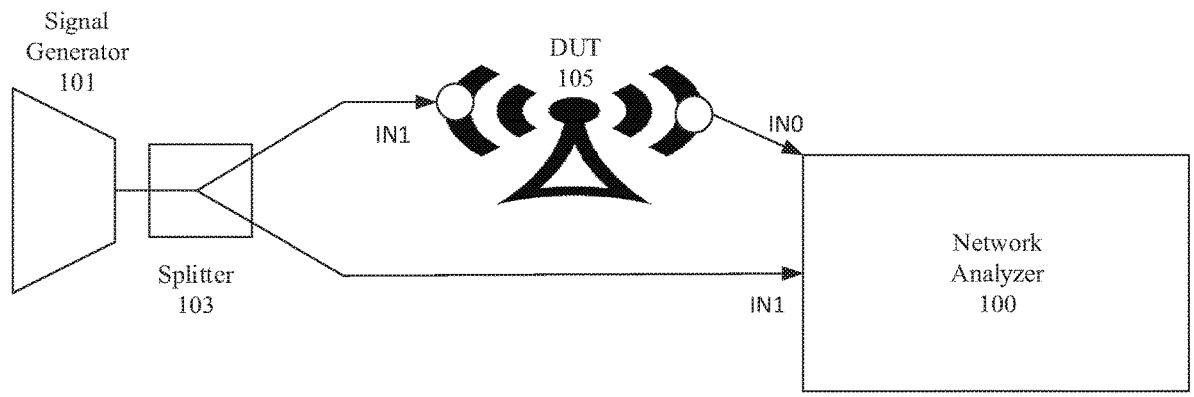
FIG. 1A illustrates a system diagram for nonlinear distortion detection, in accordance with a representative embodiment.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only, and is not intended to be limiting. As used in the specification and appended claims, the singular forms of terms 'a', 'an' and 'the' are intended to include both singular and plural forms, unless the context clearly dictates otherwise. Additionally, the terms "comprises", and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to", "coupled to", or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

In view of the foregoing, the present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

As set forth below, nonlinear distortion specific to a DUT and a frequency response function of the DUT can both be determined using the nonlinear distortion detection described herein.

FIG. 1A illustrates a system diagram for nonlinear distortion detection, in accordance with a representative embodiment. In FIG. 1A, the system includes a signal generator 101, a splitter 103, a DUT 105, and a network analyzer 100.

The signal generator 101 generates $X(\omega)$ as output to the splitter 103. $X(\omega)$ is output by the signal generator 101 to the splitter 103 as a periodically modulated RF signal. In the depicted embodiment, the splitter 103 splits, i.e., divides, $X(\omega)$. The splitter 103 outputs the divided $X(\omega)$ as-is as IN1 input to the network analyzer 100 and as an excitation input signal to the DUT 105. In response to $X(\omega)$, the DUT 105 outputs IN0 output as an excitation output signal. IN0 output is a response from the DUT 105 that reflects the response of the DUT 105 to the excitation input signal of the divided $X(\omega)$. IN0 output is then provided as an RF input to the network analyzer 100. IN1 input to the DUT 105 is undistorted, and therefore is an accurate representation of the excitation input signal to the DUT 105, whereas IN0 output from the DUT 105 is the excitation output signal from the DUT 105.

The DUT 105 may be or include, for example, an amplifier, a mixer, or a frequency converter, though nonlinear distortion detection may be used to improve testing of other types of DUTs without departing from the scope of the present teachings. Additionally, the DUT 105 in FIG. 1 is shown with two ports, though a DUT tested using nonlinear distortion detection is not limited in any way to two ports or two input/output mechanisms of any type, and may have a different number (amount) of ports or other input/output mechanisms.

The network analyzer 100 is a system configured to perform accurate and fast measurements of characteristics and behavior of the DUT 105 when the DUT 105 is excited by periodically modulated RF signals such as X(ω) provided to the DUT 105 from the splitter 103. The characteristics and behavior of the DUT 105 that are measured by the network analyzer 100 are reflected by IN0 output as the excitation output signal from the DUT 105. Examples of characteristics that can be measured by a network analyzer 100 include amplitude and phase of a periodically modulated RF signal. As explained below with respect to FIG. 1B, a network analyzer 100 may also include a memory that stores instructions and a processor that executes the instructions to control the network analyzer 100 to perform processes such as methods described herein. A variety of computer-related components and capabilities of a network analyzer 100 are described more fully with respect to FIG. 3.

The network analyzer 100 may include a different channel for each input port that receives input signals such as IN0 output from the DUT 105 and IN1 input to the DUT 105. The channels may be phase coherent, such as by having a constant phase difference, and may correspond uniquely to an input port and output port. Generally, the different channels of the network analyzer 100 may be used to measure different signals associated with an experiment, such as an input signal to DUT 105, an output signal of the DUT 105, and/or incident and reflected waves at the input and output ports of the DUT 105. For DUTs having multiple output ports, the corresponding output signals of the DUT may be measured using the different channels. The network analyzer 100 may be characterized by an ability to measure output signals of a DUT 105 within a particular bandwidth, such as from 10 MHz to 67 GHz.

An example of a network analyzer 100 that can be used for nonlinear distortion detection is a vector network analyzer (VNA) which measures amplitude and phase of a periodically modulated RF signal. Another example of a network analyzer 100 that can be used for nonlinear distortion detection is a performance network analyzer (PNA), available from Keysight Technologies, Inc.

Figure 1B:
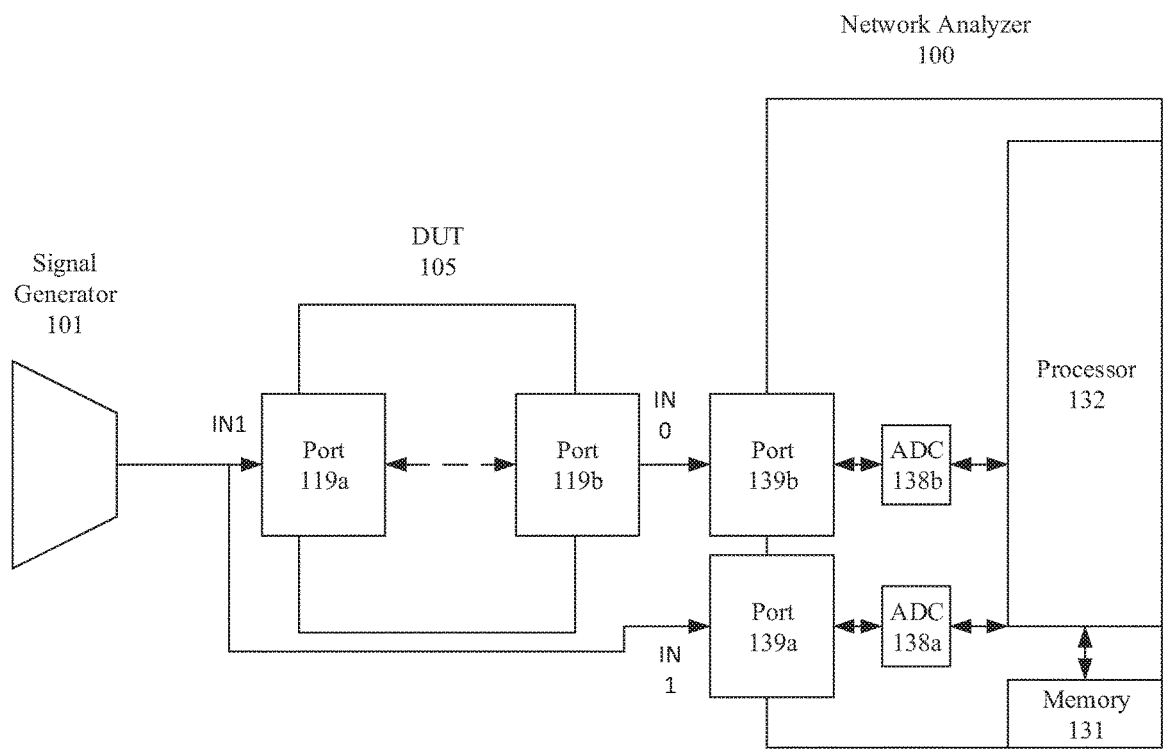
FIG. 1B illustrates detailed views of the network analyzer and the DUT in the system of FIG. 1A for nonlinear distortion detection, in accordance with a representative embodiment.

FIG. 1B illustrates detailed views of the network analyzer and the DUT in the system of FIG. 1A for nonlinear distortion detection, in accordance with a representative embodiment. In FIG. 1B, the signal generator 101 is shown with the DUT 105 and the network analyzer 100. The DUT 105 includes a port 119a and a port 119b, and the signal generator 101 provides input X(ω) from the splitter 103 in FIG. 1A as the IN1 input to the port 119a and to the network analyzer 100. The port 119b outputs IN0 output to the network analyzer 100. Of course, a DUT 105 may have a wide variety of additional circuit components such as semiconductor devices that cause the nonlinear distortion of the DUT 105 that is specifically measured by the network analyzer 100. Exemplary semiconductor components in signal generators include semiconductors used to amplify signals, such as amplifiers, or to translate signals in frequency, such as mixers and modulators. Insofar as these semiconductor components in signal generators can cause the linear distortions described herein, measuring the amount of nonlinear distortion added due to these semiconductors is important.

DUT 105 outputs IN0 output to the network analyzer 100 via port 119b. Port 119b is a port on the DUT 105 that provides for signal transmission. Ports 139a and 139b on the network analyzer 100 provide for signal reception. The ports 119a, 119b, 139a and 139b may be physical ports that are defined or arranged logically. For example, the LTE standard defines antenna ports generally as logical entities distinguished by reference signal sequences. In normal operations that do not involve testing of the sort described herein, the ports 119b, 139b could be connected to advanced antennas such as logically reconfigurable antennas or antenna arrays with multiple antenna elements or antennas. However, for the nonlinear distortion detection described herein, the port 119b can alternatively be connected to the port 139b by a wired connection.

The network analyzer 100 includes port 139b that receives IN0 output as the excitation output signal from the DUT 105, and port 139a that receives IN1 input as the excitation input signal from the signal generator 101 as split by the splitter 103 in FIG. 1A. Both signals IN0 output from the DUT 105 and IN1 input to the DUT 105 are analog signals. IN0 output is converted to a digital signal by analog-to-digital converter (ADC) 138b. IN1 input is converted to a digital signal by analog-to-digital converter (ADC) 138a. The converted digital signals from analog-to-digital converter 138a and analog-to-digital converter 138b are each provided to a processor 132 for processing in accordance with instructions otherwise stored in memory 131. The memory 131 stores instructions for the processor 132 to execute in order to perform processes as described herein.

The DUT 105 therefore receives X(ω) as the excitation input signal and outputs the excitation output signal to the network analyzer 100. The network analyzer 100 analyzes both the excitation output signal and the excitation input signal to perform the processes described herein in order to detect the nonlinear distortion specifically resulting from the DUT 105. The resulting detection excludes nonlinear distortion from the signal generator 101, for reasons that will be evident from the descriptions provided herein.

The network analyzer 100 can determine both nonlinear distortion specific to a DUT 105 and a frequency response function H(ω) of the DUT 105 based on the measured input X(ω) to the DUT 105 and the measured output Y(ω) from the DUT 105. As described with respect to FIG. 4 below, the frequency response function H(ω) can be obtained by performing cross-correlation between X(ω) and Y(ω), and then applying a fitting function. The frequency response function H(ω) is specific to the measured X(ω) and Y(ω) and does not rely on a particular standard or assumptions as to a fixed value. Additionally, as described with respect to FIG. 4 below, the frequency response function H(ω) can be applied to X(ω) in order to determine the correlated part of the Y(ω), which in turn can be used to determine the nonlinear distortion E(ω). Accordingly, a network analyzer 100 can decompose a measured output Y(ω) into a correlated component that is correlated with X(w and an uncorrelated component that is detected as nonlinear distortion E(ω).

Figure 2:
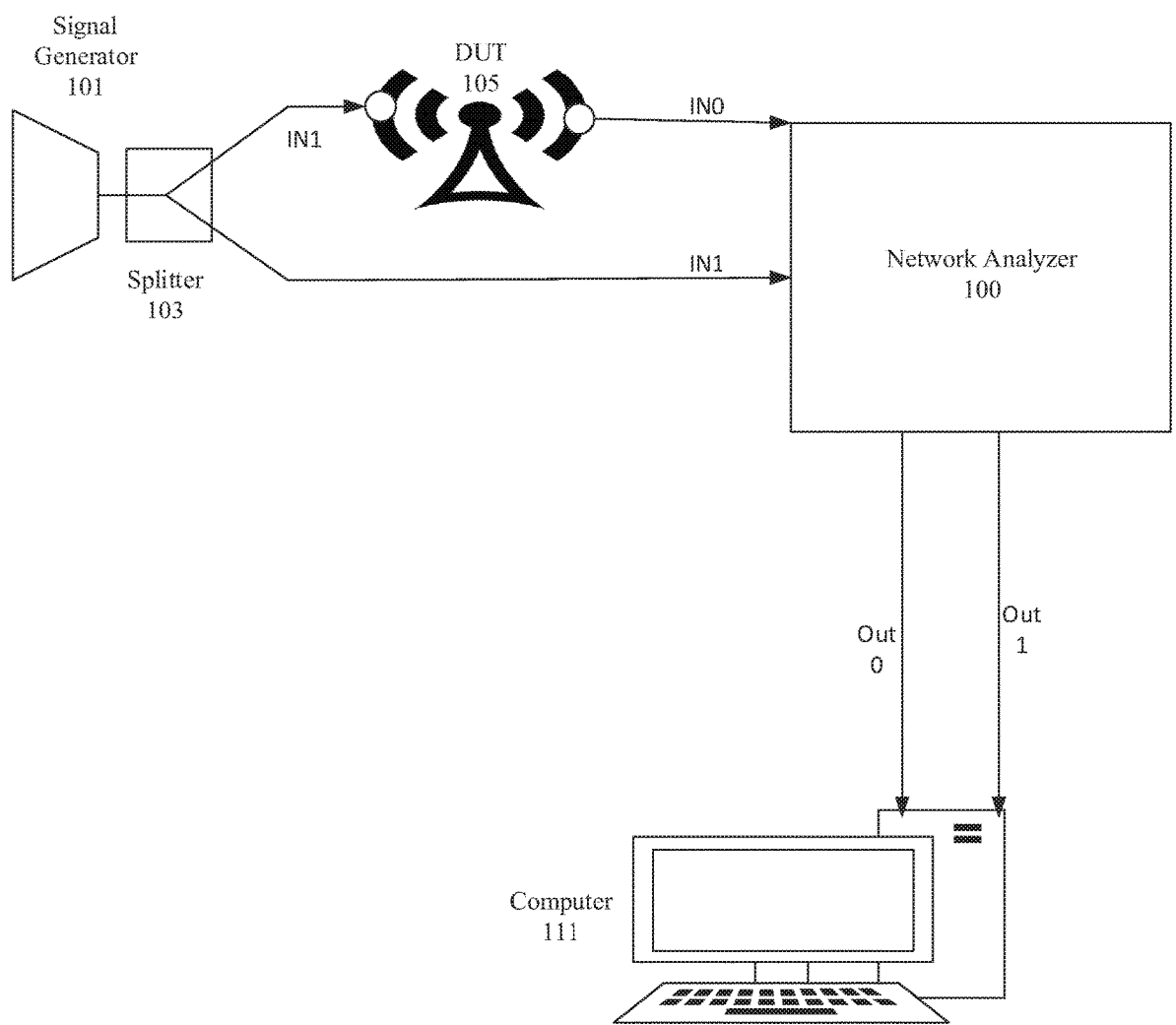
FIG. 2 illustrates another system diagram for nonlinear distortion detection, in accordance with a representative embodiment.

FIG. 2 illustrates another system diagram for nonlinear distortion detection, in accordance with a representative embodiment. In FIG. 2, the system includes a signal generator 101, a splitter 103, a DUT 105, a network analyzer 100, and a computer 111. Compared to the embodiment of FIG. 1A and FIG. 1B, the embodiment of FIG. 2 includes the computer 111 to perform processes as described herein that would otherwise be provided by the network analyzer 100. The computer 111 in FIG. 2, and the network analyzer 100 in each of FIGS. 1A, 1B and 2 may include any or all technical features described below with respect to FIG. 3. The computer 111 may be connected to the signal generator 101 by a wired or dedicated wireless data connection.

As shown in FIG. 2, the signal generator 101 provides a signal to the splitter 103, and the splitter provides the signal as IN1 input to the DUT 105 and to the network analyzer 100. The DUT 105 provides IN0 output as excitation output to the network analyzer 100. Therefore, the network analyzer 100 receives both the IN1 input as excitation input to the DUT 105 and IN0 output as excitation output from the DUT 105. The network analyzer 100 is configured to detect characteristics of both IN0 output from the DUT 105 and IN1 input to the DUT 105. The characteristics can include, for example, frequency, amplitude and phase for multiple tones of a multi-tone signal. The signal generated by signal generator 101 may be a multi-tone signal, such that both IN1 input to the DUT 105 and IN0 output from the DUT 105 correspond to the multi-tone signal from the signal generator 101. If the DUT 105 passed IN1 input through without adding distortion of any form, characteristics of the IN0 output would be expected to closely or exactly match characteristics of the IN1 input at each frequency corresponding to a tone of the multi-tone signal.

The computer 111 can obtain measurements from the network analyzer 100 and determine both nonlinear distortion specific to a DUT 105 and a frequency response function $H(\omega)$ of the DUT 105 based on the measured input $X(\omega)$ to the DUT 105 and the measured output $Y(\omega)$ from the DUT 105. As described with respect to FIG. 4 below, the frequency response function $H(\omega)$ can be obtained by performing cross-correlation between $X(\omega)$ and $Y(\omega)$, and then applying a fitting function. The frequency response function $H(\omega)$ is specific to the measured $X(\omega)$ and $Y(\omega)$ and does not rely on a particular standard or assumptions as to a fixed value. Additionally, as described with respect to FIG. 4 below, the frequency response function $H(\omega)$ can be applied to $X(\omega)$ in order to determine the correlated part of the $Y(\omega)$, which in turn can be used to determine the nonlinear distortion $E(\omega)$. Accordingly, a computer 111 can decompose a measured output $Y(\omega)$ into a correlated component that is correlated with $X(\omega)$ and an uncorrelated component that is detected as nonlinear distortion $E(\omega)$.

In an example that is applicable to any of FIGS. 1A, 1B and 2, the signal generator 101 may provide 4000 tones of a multi-tone signal, and the network analyzer 100 may analyze subgroups of the 4000 tones in groups of 100, 200, 400 or any other number appropriate for the capabilities of the network analyzer 100. In FIGS. 1A and 1B, the network analyzer 100 performs the processes described herein to analyze the subgroups. In FIG. 2, the computer 111 performs most or all of the processes described herein to analyze the subgroups of tones.

The network analyzer 100 in FIGS. 1A, 1B and 2, and the computer 111 in FIG. 2 may be configured to perform or be used to perform processes for nonlinear distortion detection described herein. As described above, nonlinear distortion can be characterized by a noise-power-ratio, an adjacent channel power ratio, and/or by the nonlinear contribution of error-vector-magnitude. The teachings described herein enable accurate measurement of $E(\omega)$, and as such noise-power-ratio, an adjacent channel power ratio, and/or the nonlinear contribution of error-vector-magnitude. The nonlinear distortion that is detected by the network analyzer 100 and/or computer 111 as a final result is specific to the DUT 105, and excludes or substantially excludes contributions from the signal generator 101. As noted previously, adjacent channel power ratio is the ratio between the noise power of the output signal adjacent to the notch and the total power present in the input channel, and measures how much nonlinear distortion generated in one frequency channel will corrupt the adjacent channel. Noise-power-ratio is the ratio between power spectral density of the output signal adjacent to the notch and power spectral density of the output signal in the notch, and measures how much nonlinear distortion is present in a frequency channel.

Figure 3:
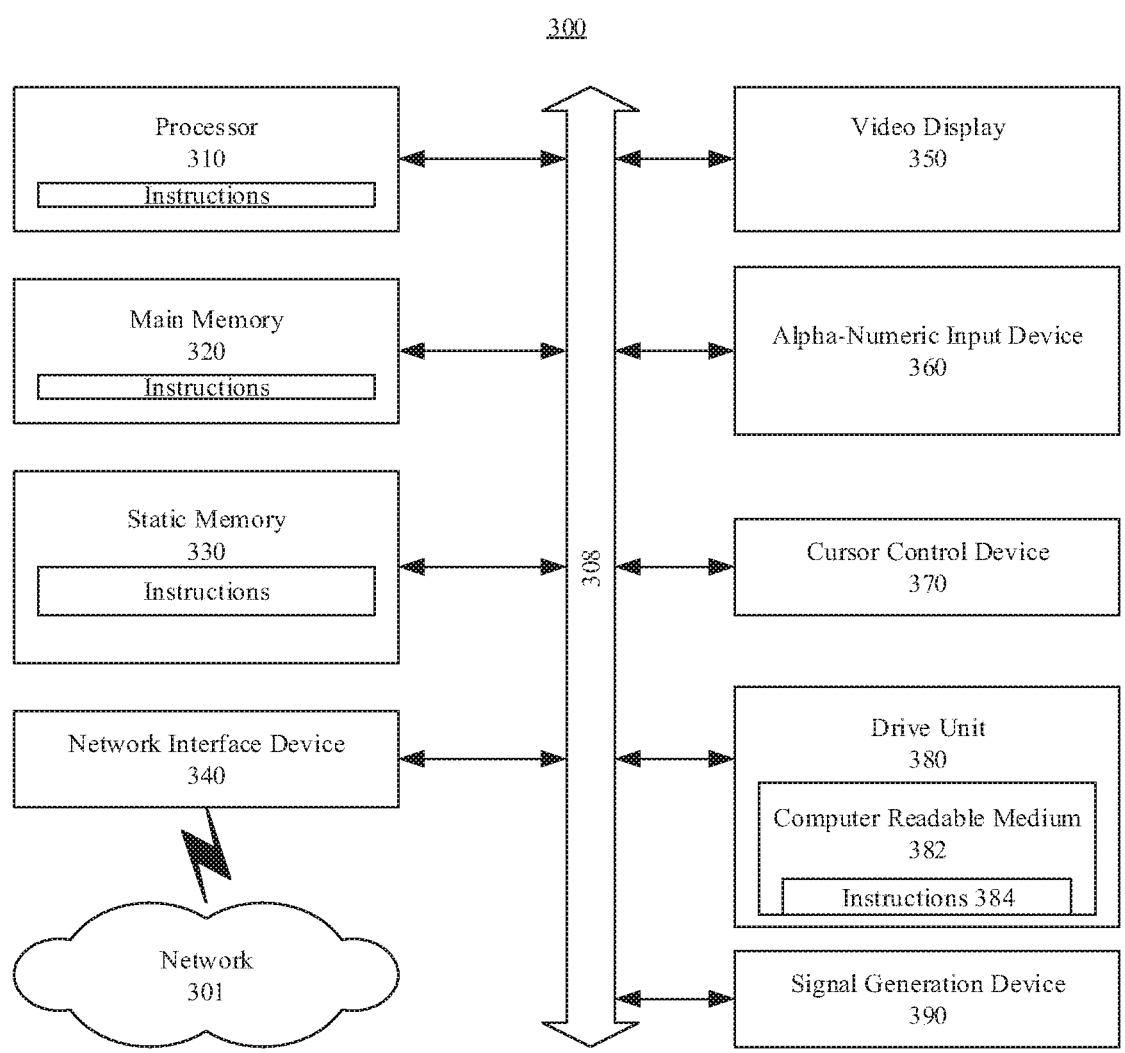
FIG. 3 illustrates an exemplary general computer system that includes a set of instructions for nonlinear distortion detection, in accordance with a representative embodiment.

FIG. 3 illustrates an exemplary general computer system that includes a set of instructions for nonlinear distortion detection, in accordance with a representative embodiment. FIG. 3 is an illustrative embodiment of a general computer system 300, on which a method of nonlinear distortion detection can be implemented. The computer system 300 can include a set of instructions that can be executed to cause the computer system 300 to perform any one or more of the methods or computer based functions disclosed herein. The computer system 300 may operate as a standalone device or may be connected, for example, using a network 301, to other computer systems or peripheral devices.

In a networked deployment, the computer system 300 may operate in the capacity of a server or as a client user computer in a server-client user network environment, or as a peer computer system in a peer-to-peer (or distributed) network environment. The computer system 300 can also be implemented as or incorporated into various devices, such as a stationary computer, a mobile computer, a personal computer (PC), a laptop computer, a tablet computer, a network analyzer or any other machine capable of executing a set of instructions (sequential or otherwise) that specify actions to be taken by that machine. The computer system 300 can be incorporated as or in a device that in turn is in an integrated system that includes additional devices. In an embodiment, the computer system 300 can be implemented using electronic devices that provide data communication. Further, while computer system 300 is illustrated in the singular, the term "system" shall also be taken to include any collection of systems or sub-systems that individually or jointly execute a set, or multiple sets, of instructions to perform one or more computer functions.

As illustrated in FIG. 3, the computer system 300 includes a processor 310. A processor for a computer system 300 is tangible and non-transitory. As used herein, the term "non-transitory" is to be interpreted not as an eternal characteristic of a state, but as a characteristic of a state that will last for a period. The term "non-transitory" specifically disavows fleeting characteristics such as characteristics of a carrier wave or signal or other forms that exist only transitorily in any place at any time. A processor is an article of manufacture and/or a machine component. A processor for a computer system 300 is configured to execute software instructions to perform functions as described in the various embodiments herein. A processor for a computer system 300 may be a general-purpose processor or may be part of an application specific integrated circuit (ASIC). A processor for a computer system 300 may also be a microprocessor, a microcomputer, a processor chip, a controller, a microcontroller, a digital signal processor (DSP), a state machine, or a programmable logic device. A processor for a computer system 300 may also be a logical circuit, including a programmable gate array (PGA) such as a field programmable gate array (FPGA), or another type of circuit that includes discrete gate and/or transistor logic. A processor for a computer system 300 may be a central processing unit (CPU), a graphics processing unit (GPU), or both. Additionally, any processor described herein may include multiple processors, parallel processors, or both. Multiple processors may be included in, or coupled to, a single device or multiple devices.

Moreover, the computer system 300 includes a main memory 320 and a static memory 330 that can communicate with each other via a bus 308. Memories described herein are tangible storage mediums that can store data and executable instructions, and are non-transitory during the time instructions are stored therein. As used herein, the term "non-transitory" is to be interpreted not as an eternal characteristic of a state, but as a characteristic of a state that will last for a period. The term "non-transitory" specifically disavows fleeting characteristics such as characteristics of a carrier wave or signal or other forms that exist only transitorily in any place at any time. A memory described herein is an article of manufacture and/or machine component. Memories described herein are computer-readable mediums from which data and executable instructions can be read by a computer. Memories as described herein may be random access memory (RAM), read only memory (ROM), flash memory, electrically programmable read only memory (EPROM), electrically erasable programmable read-only memory (EEPROM), registers, a hard disk, a removable disk, tape, compact disk read only memory (CD-ROM), digital versatile disk (DVD), floppy disk, blu-ray disk, or any other form of storage medium known in the art. Memories may be volatile or non-volatile, secure and/or encrypted, unsecure and/or unencrypted.

As shown, the computer system 300 may further include a video display unit 350, such as a liquid crystal display (LCD), an organic light emitting diode (OLED), a flat panel display, a solid-state display, or a cathode ray tube (CRT). Additionally, the computer system 300 may include an input device 360, such as a keyboard/virtual keyboard or touch-sensitive input screen or speech input with speech recognition, and a cursor control device 370, such as a mouse or touch-sensitive input screen or pad. The computer system 300 can also include a disk drive unit 380, a signal generation device 390, such as a speaker or remote control, and a network interface device 340.

In an embodiment, as depicted in FIG. 3, the disk drive unit 380 may include a computer-readable medium 382 in which one or more sets of instructions 384, e.g. software, can be embedded. Sets of instructions 384 can be read from the computer-readable medium 382. Further, the instructions 384, when executed by a processor, can be used to perform one or more of the methods and processes as described herein. In an embodiment, the instructions 384 may reside completely, or at least partially, within the main memory 320, the static memory 330, and/or within the processor 310 during execution by the computer system 300.

In an alternative embodiment, dedicated hardware implementations, such as application-specific integrated circuits (ASICs), programmable logic arrays and other hardware components, can be constructed to implement one or more of the methods described herein. One or more embodiments described herein may implement functions using two or more specific interconnected hardware modules or devices with related control and data signals that can be communicated between and through the modules. Accordingly, the present disclosure encompasses software, firmware, and hardware implementations. Nothing in the present application should be interpreted as being implemented or implementable solely with software and not hardware such as a tangible non-transitory processor and/or memory.

In accordance with various embodiments of the present disclosure, the methods described herein may be implemented using a hardware computer system that executes software programs. Further, in an exemplary, non-limited embodiment, implementations can include distributed processing, component/object distributed processing, and parallel processing. Virtual computer system processing can be constructed to implement one or more of the methods or functionality as described herein, and a processor described herein may be used to support a virtual processing environment.

The present disclosure contemplates a computer-readable medium 382 that includes instructions 384 or receives and executes instructions 384 responsive to a propagated signal; so that a device connected to a network 301 can communicate data over the network 301. Further, the instructions 384 may be transmitted or received over the network 301 via the network interface device 340.

Figure 4:
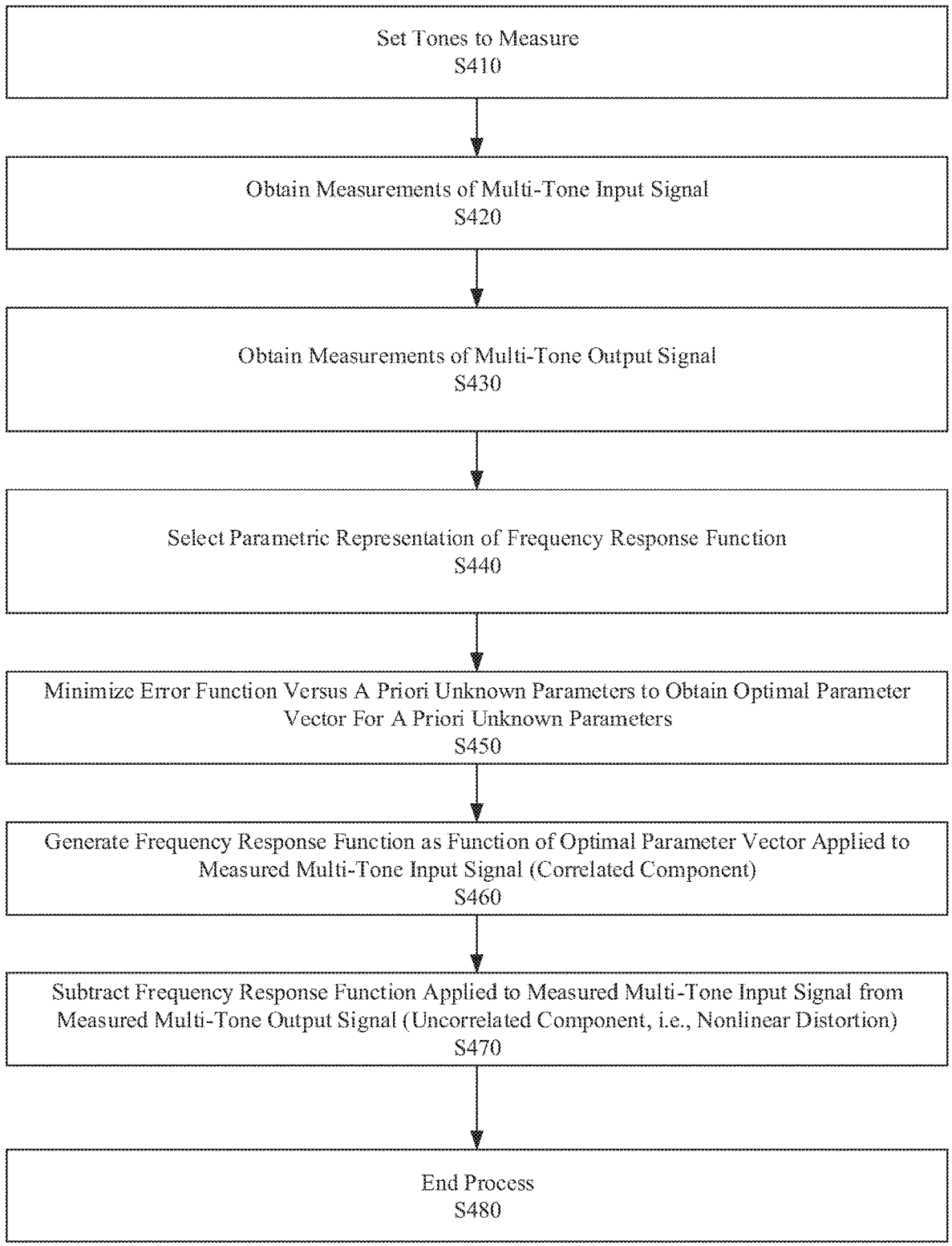
FIG. 4 illustrates a process for nonlinear distortion detection, in accordance with a representative embodiment.

FIG. 4 illustrates a process for nonlinear distortion detection, in accordance with a representative embodiment. In FIG. 4, the process starts with setting tones for the network analyzer 100 to measure at S410. The tones measured by the network analyzer 100 in any instance may be a subgroup of a complete set of tones that are generated by the signal generator 101. The tones are spaced apart from one another on the frequency spectrum. As an example, a multi-tone signal may be provided continuously from a signal generator 101, and subgroups of individual tones of the multi-tone signal may be set at S410 to measure by the network analyzer 100 one subgroup at a time.

At S420, measurements of the multi-tone input signal IN1 input are obtained. The measurements can be obtained by the network analyzer 100 receiving IN1 input and analyzing IN1 input to detect characteristics of the multi-tone input signal. Characteristics of the multi-tone input signal can include amplitude and phase at each of the frequencies corresponding to individual tones of a subgroup of tones of the multi-tone input signal. The measurements obtained at S420 can also be obtained when a computer 111 receives the measurements or underlying IN1 input from or via the network analyzer 100, as in FIG. 2. Processes described below can be performed by the network analyzer 100 as in FIG. 1A and FIG. 1B, or by the computer 111 in FIG. 2, or by both the network analyzer 100 and the computer 111.

At S430, measurements of the multi-tone output signal IN0 output are obtained. As with the multi-tone input signal IN1 input, measurements of the multi-tone output signal IN0 output can be obtained by the network analyzer 100 receiving IN0 output and analyzing IN0 output to detect characteristics of the multi-tone input signal. Characteristics of the multi-tone output signal can include amplitude and phase at each of the frequencies corresponding to individual tones of a subgroup of tones of the multi-tone input signal. The measurements of the IN0 output at S430 are comparable to measurements of the IN1 input from S420, so the measurements may overlap partly or entirely in terms of being measurements of magnitude of the same characteristics of the same tones at the same frequencies and in the same frequency band. The measurements obtained at S430 can also be obtained when a computer 111 receives the measurements or underlying IN0 output from or via the network analyzer 100, as in FIG. 2.

At S440, a parametric representation of a frequency response function $H(\omega)$ for the DUT 105 can be selected. As described above, a frequency response function $H(\omega)$ describes the relationship between an input signal $X(\omega)$ to a DUT 105 and an output signal $Y(\omega)$ from the DUT 105. A parametric representation is a functional representation that is flexible enough to represent all possible frequency response functions, and that is a function of two variables, i.e., frequency ($\omega$) and the vector of a which is a vector of a priori unknown parameters $\vec{\alpha}$. The parametric representation may be a set of equations used to define the frequency response function H($\omega$) as a geometric object such as a curve or surface. The a priori unknown parameters $\vec{\alpha}$ are parameters which are deduced logically as candidate parameters capable of representing all possible frequency response functions. The vector of the a priori unknown parameters $\vec{\alpha}$ should be sufficiently large to represent all possible frequency response functions, but care should be taken not to include so many parameters that the variance of an optimal parameter vector $\vec{\alpha}_{min}$ will increase more than intended. The optimal parameter vector $\vec{\alpha}_{min}$ is discussed more below.

Correlation and decomposing of an output signal Y($\omega$) can be performed using a least-squares-error estimation process for determining the frequency response function H($\omega$). This is done as follows. An error function of the vector of a priori unknown parameters $\vec{\alpha}$ is defined by equation (3) as follows:

$$\text{Err}(\vec{\alpha}) = \int_{\omega_{min}}^{\omega_{max}} |Y(\omega) - H(\vec{\alpha}, \omega) X(\omega)|^2 d\omega \quad (3)$$

In equation (3) above, $w_{min}$ and $w_{max}$ represent the frequency range of interest. The remaining variables and terms in equation (3) have been previously defined.

At S450, the error function of the vector of the a priori unknown parameters $\vec{\alpha}$ is minimized using equation (3) to generate the optimal parameter vector $\vec{\alpha}_{min}$ for the a priori unknown parameters $\alpha$. Minimizing the error function of equation (3) results in the optimal parameter vector $\vec{\alpha}_{min}$. The optimal parameter vector $\vec{\alpha}_{min}$ can then be used to estimate the error function of the nonlinear distortion E($\omega$).

At S460, the process generates the frequency response function as a function of the optimal parameter vector $\vec{\alpha}_{min}$ and frequency ($\omega$) applied to the measured multi-tone input signal IN1 input. The processing at S460 results in detecting the correlated component of the measured multi-tone output signal IN0 output when applied to X($\omega$). An estimate of the nonlinear distortion $E_{est}(\omega)$ is provided by equation (4):

$$E_{est}(\omega) = Y(\omega) - H(\vec{\alpha}_{min}, \omega) X(\omega) \quad (4)$$

In equation (4) above, the estimate of the nonlinear distortion is $E_{est}(\omega)$. This estimate is based on both the excitation output of the DUT 105, i.e., Y($\omega$), the excitation input to the DUT 105, i.e., X($\omega$), and the optimal parameter vector Insofar as the optimal parameter vector $\vec{\alpha}_{min}$ is based on the minimized error function of equation (3), this shows the importance of properly selecting the a priori unknown parameters $\alpha$ so as not to unduly increase the variance of the resultant frequency response function but also so as to provide a parameter vector with a length sufficient to represent all possible frequency response functions.

In an embodiment, the frequency response function can be chosen using the form of equation (5) as follows:

$$H(\vec{\alpha}, \omega) = H_{SPLINE}(\vec{s}, \omega) e^{-i\omega\tau} \quad (5)$$

In equation (5), T is a parameter equivalent to the group delay of the DUT 105. $H_{SPLINE}$ represents a complex valued spline fitting function based on the parameter vector s and the frequency $\omega$. A spline is a piecewise polynomial curve, and the spline fitting function $H_{SPLINE}$ in equation (5) is a linear function of the parameter vector s. First, the parameter T is determined by performing a time domain cross-correlation between X((x) and VA. Afterwards, the parameter vectors of $H_{SPLINE}$ are determined.

At S470, the frequency response function applied to the measured multi-tone input signal is subtracted from the measured multi-tone output signal. The processing at S470 results in detecting the uncorrelated component of the measured multi-tone output signal IN0 output as E($\omega$). In other words, at S470, the nonlinear distortion specific to the DUT 105 is isolated by removing the correlated component of the measured multi-tone output signal IN0 output from the measured multi-tone output signal IN0 output. The uncorrelated component is E($\omega$), and the correlated component is X($\omega$)*H($\omega$). At S480, the process in FIG. 4 ends.

As further explanation of the nonlinear distortion detection provided herein, a perfect signal generator generating a signal $X_{ideal}(\omega)$ is illustrative. Such a perfect signal generator would produce an output of the DUT 105 as in equation below:

$$Y_{ideal}(\omega) = H(\omega) X_{ideal}(\omega) + E(\omega) \quad (6)$$

Performing the correlation operation described by equation (4) on $Y_{ideal}$ and $X_{ideal}$ results in E($\omega$). By adding a small distortion $\varepsilon(\omega)$ to the perfect signal generator, the overall input power can be preserved. In this case, the resulting output signal Y($\omega$) is provided by equation (7) as follows:

$$Y(\omega) = H(\omega)(X_{ideal}(\omega) + \varepsilon(\omega)) + E(\omega) + O[\varepsilon^2] \quad (7)$$

In equation (7), the symbol Q[$\varepsilon^2$] stands for a contribution of the second order in E($\omega$). Performing the correlation operation will result in an estimate for the error equal to E($\omega$)+O[$\varepsilon^2$]. In practice $\varepsilon(\omega)$ may often be below −40 dBc, which would result in an error in determining the nonlinear distortion E($\omega$) in the order of −80 dBc. An error of −80 dBc is insignificant for the majority of applications, and this result can be achieved because, through the correlation process, any first order errors in the input signal end up in the correlated part of the output spectrum, and are therefore eliminated from the determination of E($\omega$).

As set forth above, a network analyzer 100 and/or a computer 111 can decompose a measured output Y($\omega$) into a correlated component that is correlated with X($\omega$) and an uncorrelated component that is detected as nonlinear distortion E($\omega$). This can be done by first performing cross-correlation between Y($\omega$) and X($\omega$) and applying, for example, a fitting function, to obtain a frequency response function H($\omega$) specific to a DUT 105. As should be evident from the explanations above, the decomposing is performed independent of modulation format and is not particular to a particular communications standard. Furthermore, the decomposing is insensitive to phase relationships between individual tones of the multi-tone input signal and the multi-tone output signal.

Figure 5A:
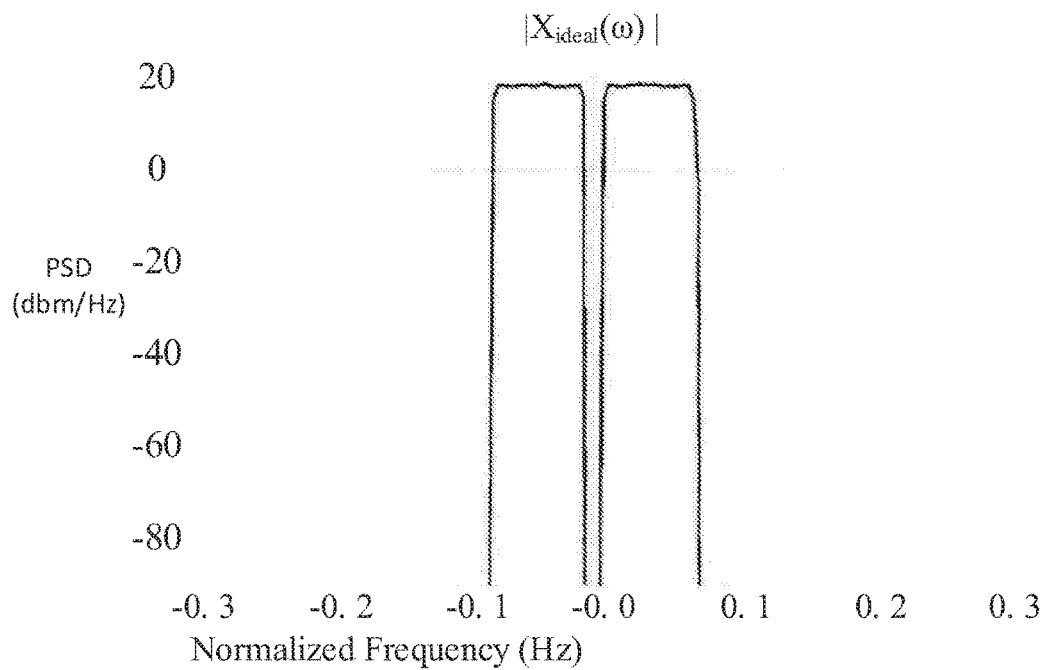
FIG. 5A illustrates power spectral density of $|X_{ideal}(\omega)|$ for nonlinear distortion detection, in accordance with a representative embodiment.
Figure 5B:
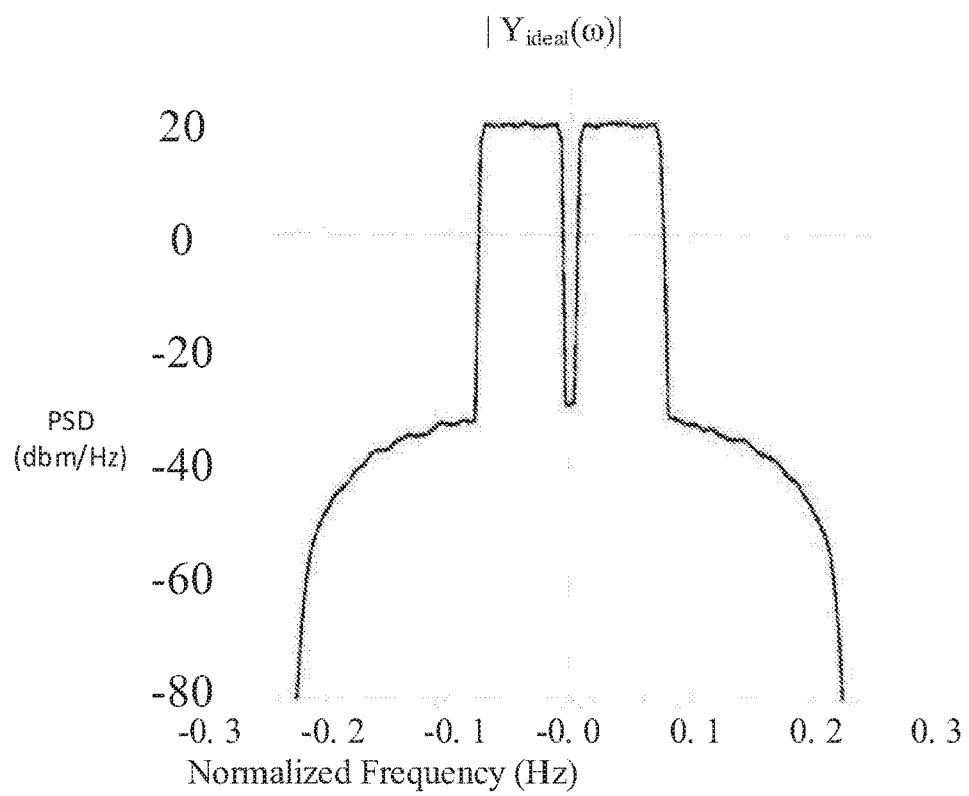
FIG. 5B illustrates power spectral density of $|Y_{ideal}(\omega)|$ for nonlinear distortion detection, in accordance with a representative embodiment.

In several FIGs. that follow, simulated data is used to illustrate nonlinear distortion detection. In FIGS. 5A and 5B an ideal input signal $X_{ideal}(\omega)$ contains 4001 pseudo-random uniformly spaced tones with a notch in the middle that has the width of 401 of the uniformly-spaced tones. The tones in FIGS. 5A and 5B have both a random amplitude and a random phase.

FIG. 5A illustrates power spectral density of $|X_{ideal}(\omega)|$ for nonlinear distortion detection, in accordance with a representative embodiment. In FIG. 5A, the power spectral density of $|X_{ideal}(\omega)|$ is illustrated using a normalized frequency since the data is simulated. As shown in FIG. 5A, a notch is formed between two columns. The X axis in FIG. 5A and similar FIGs. herein is for values of the normalized frequency in hertz (Hz). The Y axis in FIG. 5A and similar FIGs. herein is for values of the power spectral density in decibel-milliwatts, which in turn is the power ratio in decibels (dB) of the measured power referenced to one milliwatt (mW).

Next the corresponding complex envelope is calculated and sent through a compressive nonlinear operator used by the network analyzer 100. As an example, a Keysight network analyzer may use a Tan h(.) function for this purpose. A complex envelope is output with a spectrum $Y_{ideal}(\omega)$.

Figure 7:
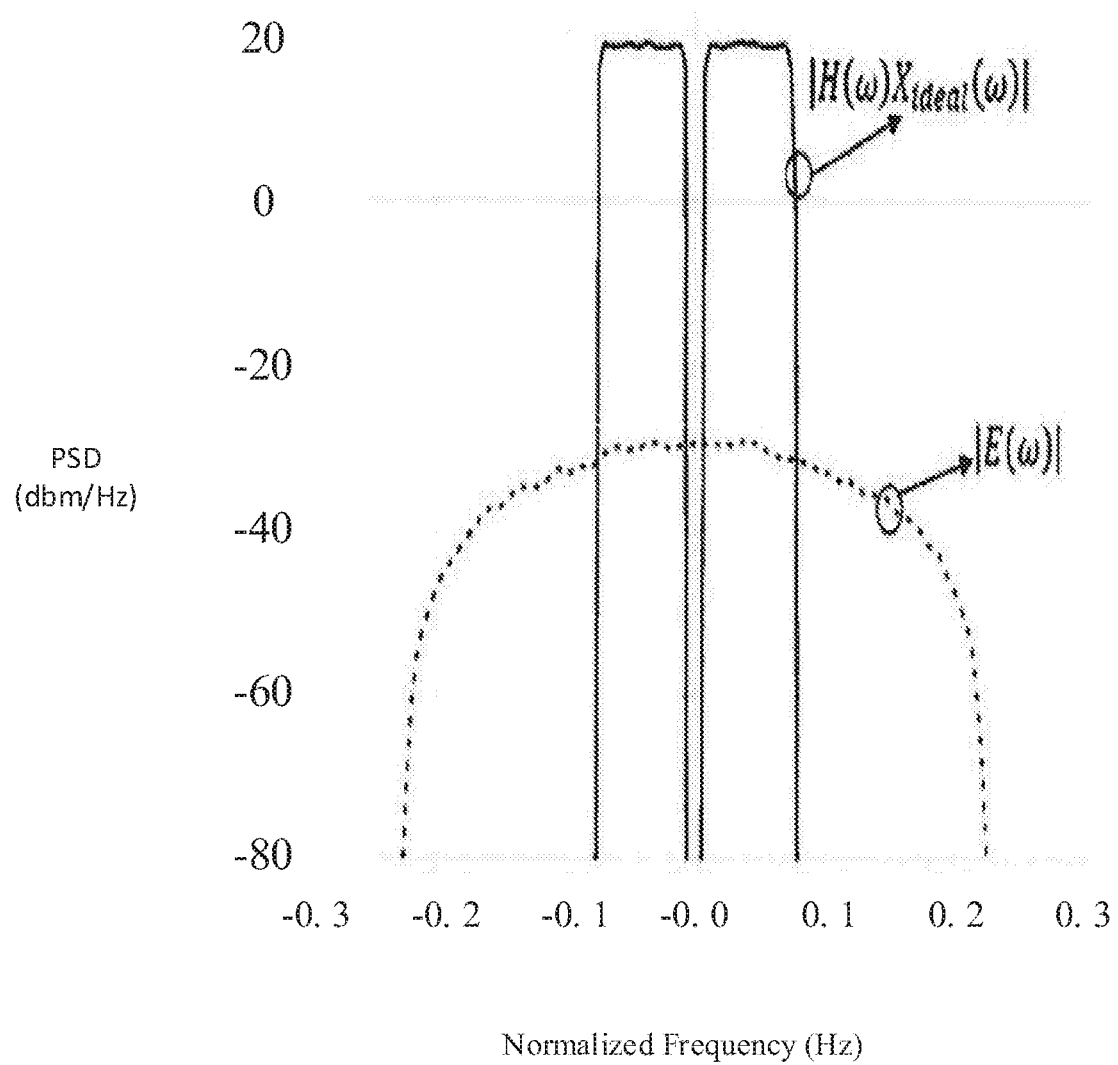
FIG. 7 illustrates power spectral density of correlated and uncorrelated parts of $Y_{ideal}(\omega)$ for nonlinear distortion detection, in accordance with a representative embodiment.

FIG. 5B illustrates power spectral density of $|Y_{ideal}(\omega)|$ for nonlinear distortion detection, in accordance with a representative embodiment. Compared to FIG. 5A, the columns in FIG. 5B are similar, shoulders are formed to the outside of each column and the notch in the middle is partly filled. The shoulders and filling of the notch are due to nonlinear distortions caused by the DUT 105. Next $H(\omega)$ is estimated using a spline fit. The estimated $H(\omega)$ is then used to calculate the part of $Y_{ideal}(\omega)$ that is correlated with the input signal ($H(\omega)X_{ideal}(\omega)$) as well as the residual which is equal to an estimate for $E(\omega)$. The power spectral densities of the estimated correlated and uncorrelated part are depicted in FIG. 7. Note that the power spectral density of $E(\omega)$ is a smooth function of frequency, regardless of whether input power is present or not. This indicates that the spline algorithm properly separates the correlated and uncorrelated parts of the output signal.

Figure 8A:
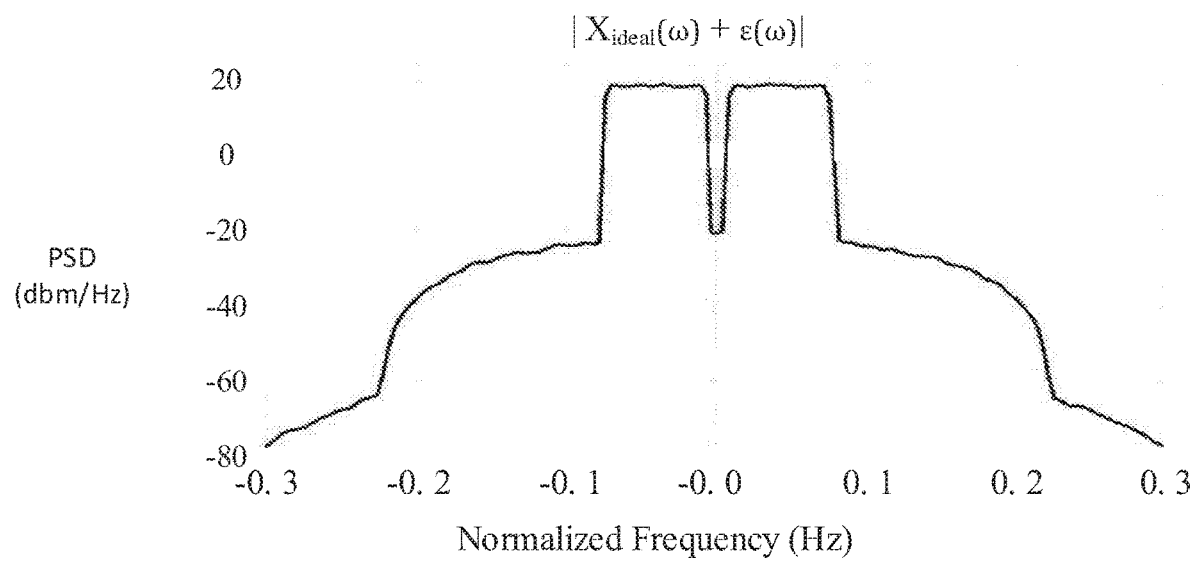
FIG. 8A illustrates power spectral density of $|X_{Ideal}(\omega)+E(\omega)|$ for nonlinear distortion detection, in accordance with a representative embodiment.
Figure 8B:
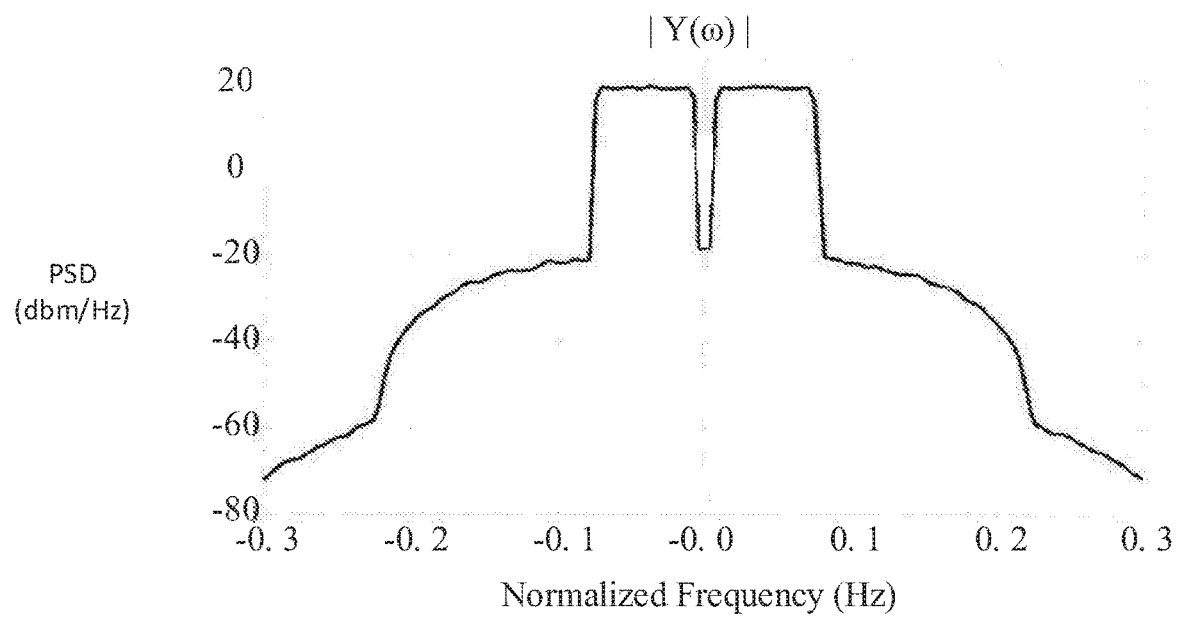
FIG. 8B illustrates power spectral density of $|Y(\omega)|$ for nonlinear distortion detection, in accordance with a representative embodiment.

A signal that has already been distorted can be created by applying a compressive nonlinear operator on the ideal input signal $X_{ideal}(\omega)$. This distorted input signal is denoted by $X_{ideal}(\omega)+\varepsilon(\omega)$, where $\varepsilon(\omega)$ represents the nonlinear distortion of the input signal. The power spectral density of the distorted input signal is depicted in FIG. 8A. Note that the amount of distortion present in the input signal is about 10 decibels higher than the amount of distortion that will be introduced by the DUT 105, as can be derived from looking at the notch depths in FIGS. 5B and 8A. The same nonlinear distortion as used in FIG. 5B is then applied to the distorted input signal. This results in $Y(\omega)$ as depicted in FIG. 8B.

Figure 6:
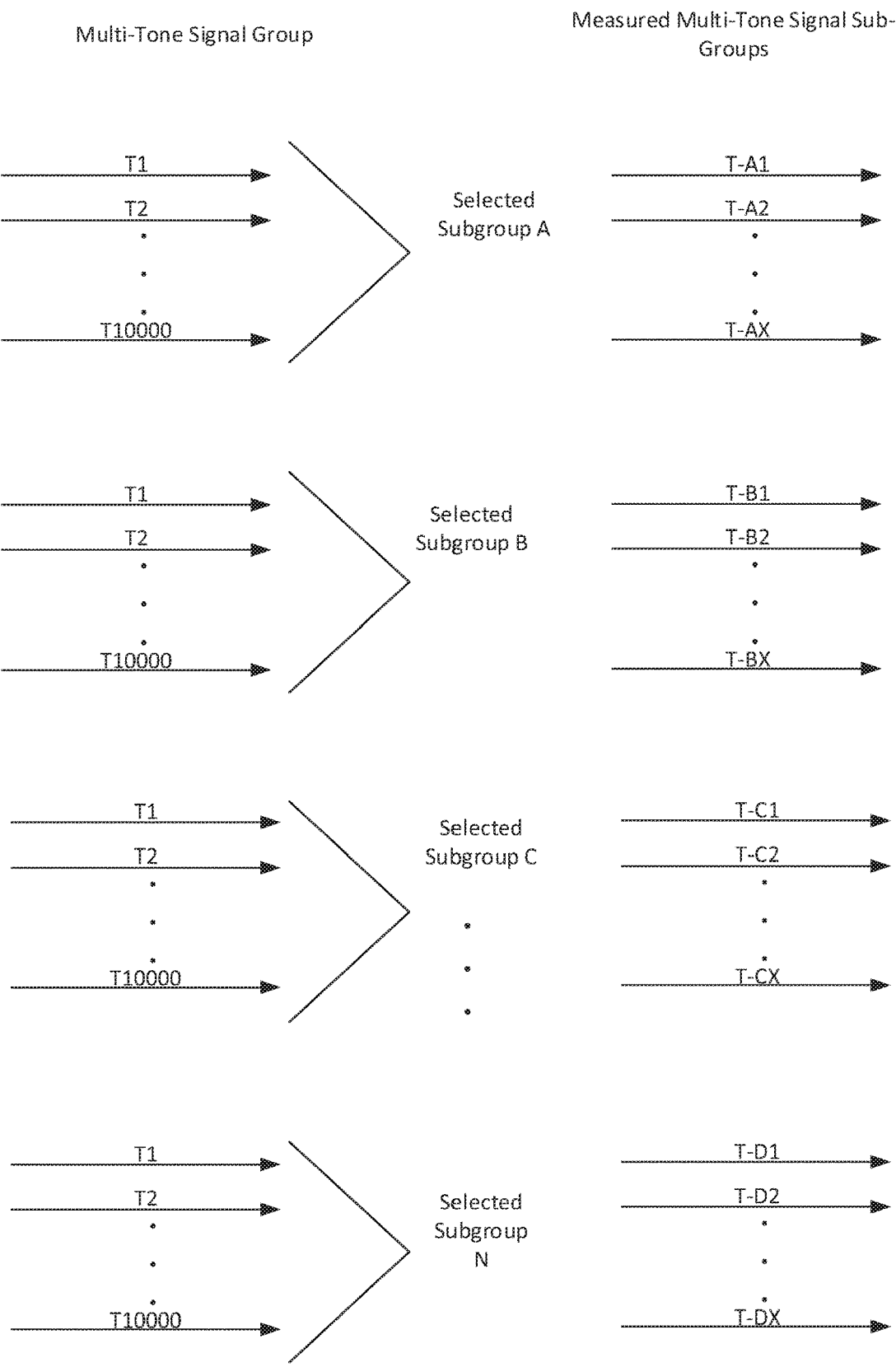
FIG. 6 illustrates selective subgrouping of tones of a multi-tone signal group for nonlinear distortion detection, in accordance with a representative embodiment.

FIG. 6 illustrates selective subgrouping of tones of a multi-tone signal group for nonlinear distortion detection, in accordance with a representative embodiment. As can be seen in FIG. 6, 10000 tones are repeatedly or continuously sent as a multi-tone input signal. The tones are sent from the signal generator 101. The tones are used as excitation input by the DUT 105. In FIG. 6, IN0 output is read for selected subgroups of tones being repeatedly or continuously input to the DUT 105. In FIG. 6, the sequence of subgroups is from A to N, and the individual tones of the subgroups range from T-A1 to T-AX for subgroup A, from T-B1 to T-BX for subgroup B, from T-C1 to T-CX for subgroup C, and from T-D1 to T-DX for subgroup N.

FIG. 7 illustrates power spectral density of correlated and uncorrelated Parts of $Y_{ideal}(\omega)$ for nonlinear distortion detection, in accordance with a representative embodiment. As can be seen in FIG. 7, the nonlinear distortion is identified as $|E(\omega)|$ by a pattern of dots or dashes that corresponds to the added portions of the power spectral density that appear in FIG. 5B compared to FIG. 5A.

In an embodiment, an idealized error vector magnitude of the DUT 105 can be calculated using the frequency response function and the nonlinear distortion identified as described herein. Specifically, if we identify a measured $X(\omega)$ as $X_{meas}(\omega)$ and a measured $Y(\omega)$ as $Y_{meas}(\omega)$ the frequency response function corresponds to $H_{meas}(\omega)$ and the nonlinear distortion corresponds to Emeas($\omega$). By assuming that an idealized $X_{ideal}(\omega)$ is approximately equal to $X(\omega)$, the idealized $Y_{ideal}(\omega)$ can be obtained from the frequency response function and nonlinear distortion as modeled from the measured $X(\omega)$ and $Y(\omega)$. Specifically, $Y_{ideal}(\omega)$ will equal $H_{meas}(\omega)*X_{ideal}(\omega)$+Emeas($\omega$). From $Y_{ideal}(\omega)$, an idealized error vector magnitude can be calculated using known methods.

In other words, another specific application of the nonlinear distortion detection described herein is the calculation of an idealized error vector magnitude for a DUT 105, and this can be identified for an idealized input $X_{ideal}(\omega)$ that is specifically envisioned for use by, for example, an end user. The specific application will result from measuring the input $X(\omega)$ and output $Y(\omega)$ and modeling the frequency response function $H_{meas}(\omega)$ and the nonlinear distortion Emeas($\omega$). Then, the modeled frequency response function $H_{meas}(\omega)$ and nonlinear distortion Emeas($\omega$) are applied to an idealized input $X_{ideal}(\omega)$, and then used to obtain the idealized output $Y_{ideal}(w)$. $Y_{ideal}(w)$ is then used to obtain the idealized error vector magnitude of the DUT 105 using calculations from known methods.

FIG. 8A illustrates power spectral density of $|X_{ideal}(\omega)+\varepsilon(\omega)|$ for nonlinear distortion detection, in accordance with a representative embodiment. In FIG. 8A, the power spectral density is of the distorted input signal. The amount of distortion present in the input signal is about 10 dB higher than the amount of distortion that will be introduced by the DUT 105, as can be derived from looking at the notch depths in FIG. 5B and FIG. 8A. The distorted input signal in FIG. 8A can be modeled by a network analyzer 100, such as by applying Tan h(.) as a function using a Key sight network analyzer. The distorted input signal is denoted by $X_{ideal}(\omega)+|\varepsilon(\omega)|$, where $\varepsilon(\omega)$ represents the nonlinear distortion of the input signal.

FIG. 8B illustrates power spectral density of $|Y(\omega)|$ for nonlinear distortion detection, in accordance with a representative embodiment. FIG. 8B shows the result of using the same nonlinear distortion as in FIG. 5B applied to the distorted input signal shown in FIG. 8A. The result is $Y(\omega)$.

Figure 10:
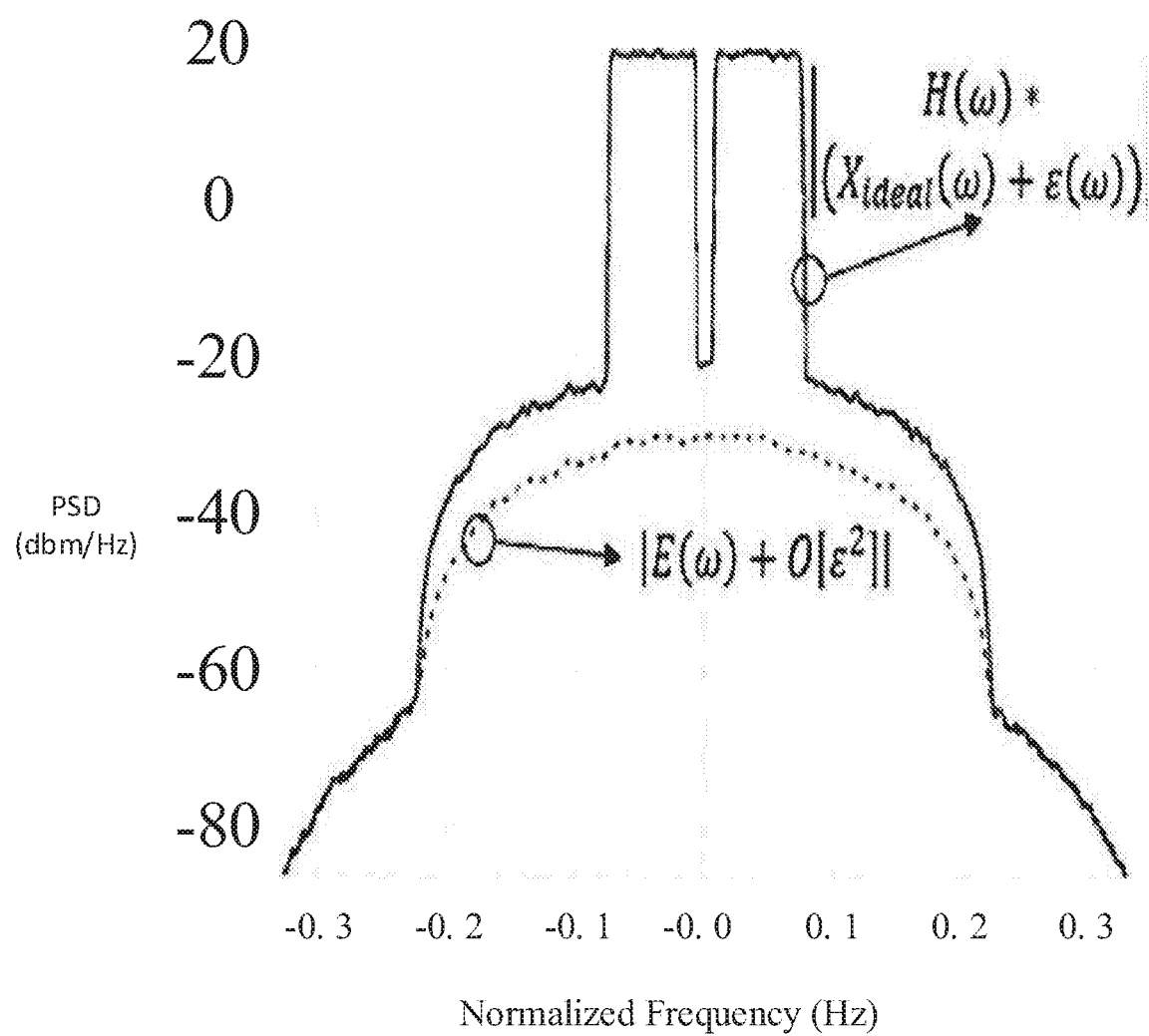
FIG. 10 illustrates power spectral density of $H(\omega)*(X_{ideal}(\omega))+\varepsilon(\omega))$ and $|E(\omega)+0[\varepsilon^2]|$ for nonlinear distortion detection, in accordance with a representative embodiment.

The output signal generated by applying the nonlinear distortion to the distorted. input signal is then split into a correlated and an uncorrelated part by estimating $H(\omega)$. The correlated part $H(\omega)$ ($X_{ideal}(\omega)+\varepsilon(\omega)$) and the uncorrelated part $E(\omega)+O[\varepsilon^2]$ are depicted in FIG. 10. The power spectral density of the uncorrelated part is about 10 dB lower than the level of the correlated part.

Figure 11:
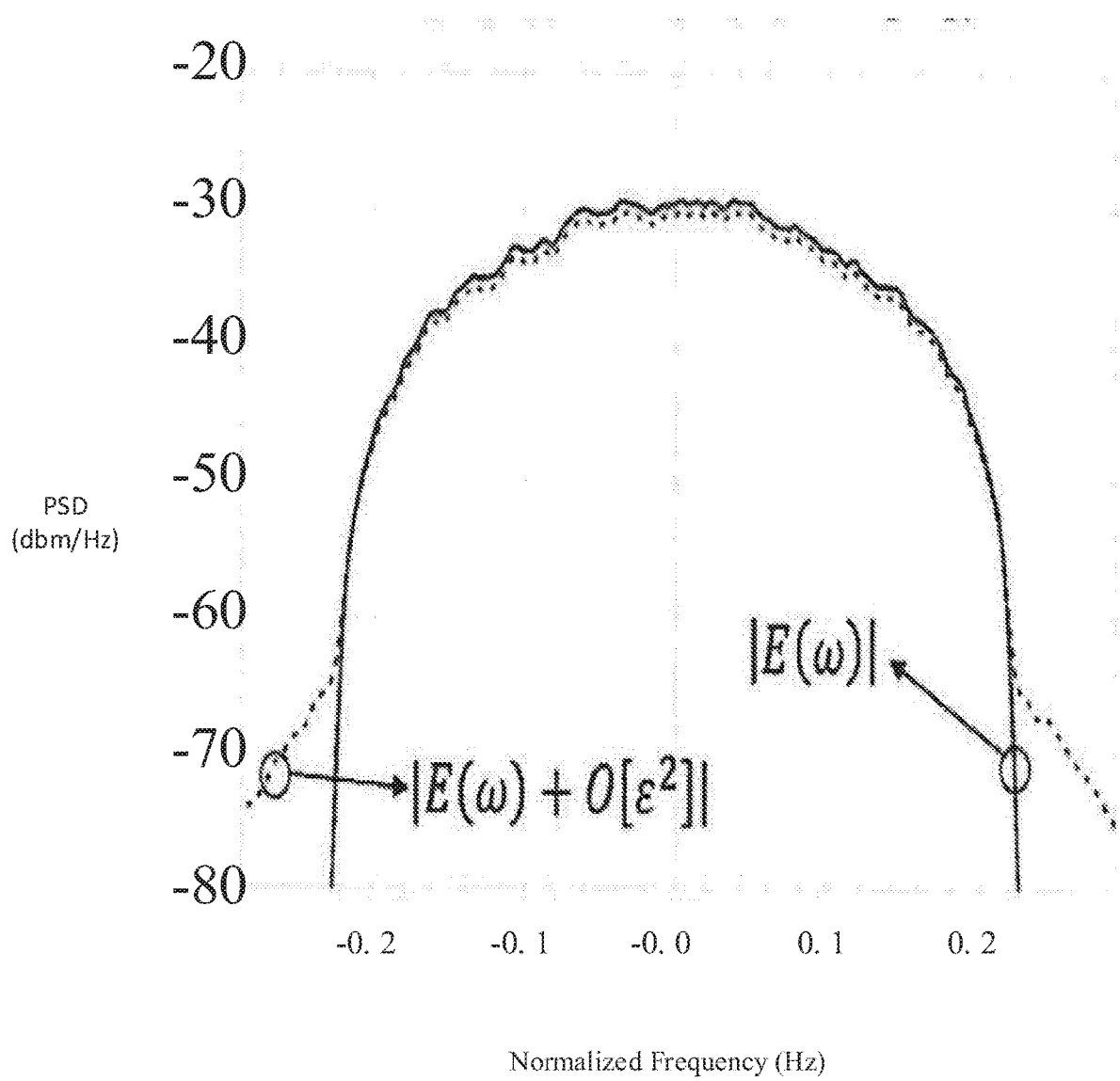
FIG. 11 illustrates power spectral density of $|E(\omega)|$ and $|E(\omega)+0[\varepsilon^2]|$ for nonlinear distortion detection, in accordance with a representative embodiment.
Figure 12:
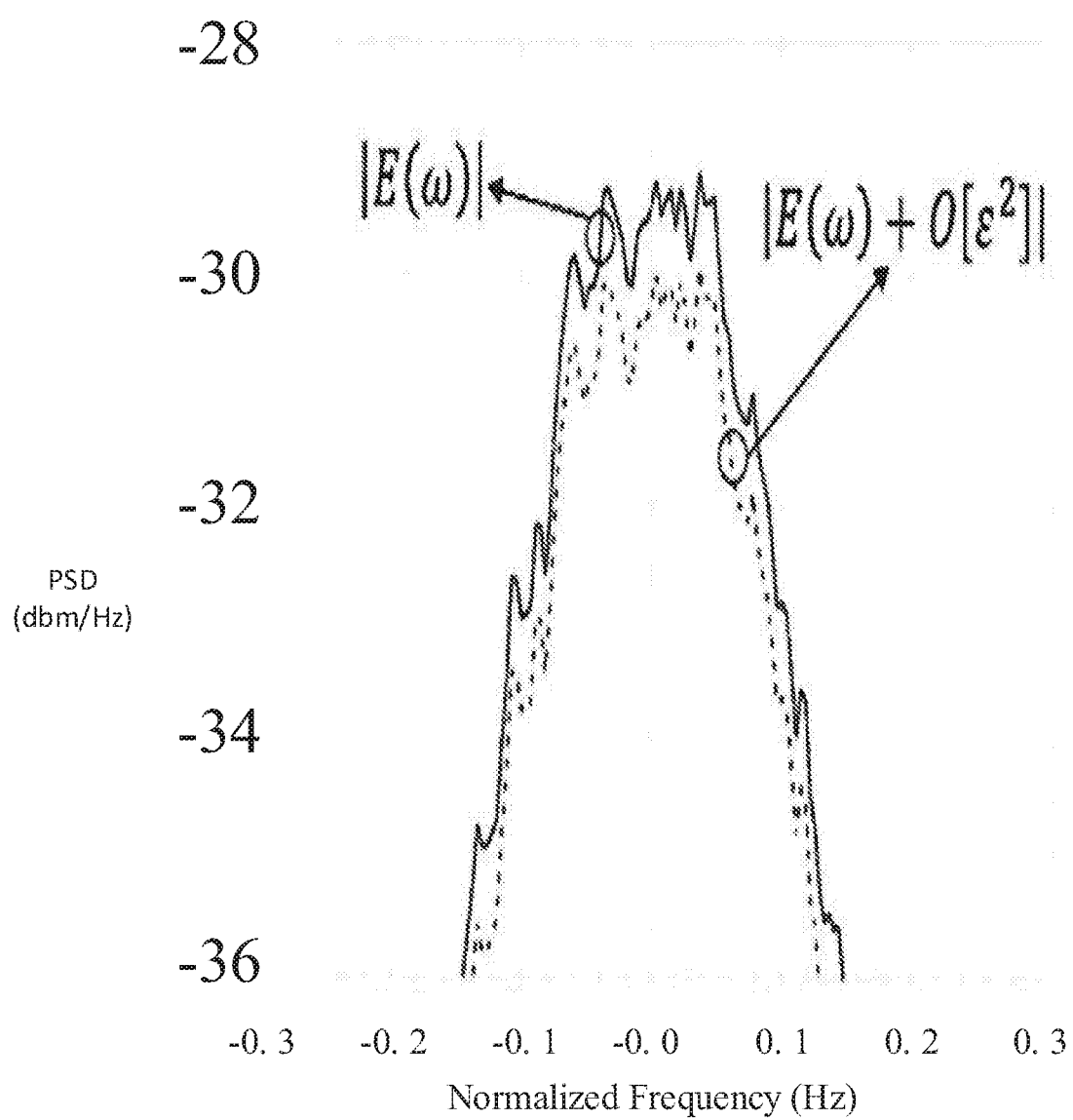
FIG. 12 illustrates details of power spectral density of $|E(\omega)|$ and $|E(\omega)+0[\varepsilon^2]|$ for nonlinear distortion detection, in accordance with a representative embodiment.

$E(\omega)$, the uncorrelated part of the ideal experiment using the ideal input signal, is next compared with $E(\omega)+O[\varepsilon^2]$, the uncorrelated part of the experiment using the distorted input signal. As shown in FIGS. 11 and 12, the levels of $E(\omega)$ and $E(\omega)+O[\varepsilon^2]$ correspond very well up to a level of about −80 dBc. The output power spectral density in the channel is about 20 dBm/Hz. The difference between the ideal experiment and the experiment using the distorted input signal is less than 1 dB. This is quite remarkable as the distortion present with the non-ideal experiment is about 10 dB higher than the level created by the DUT 105.

Figure 9:
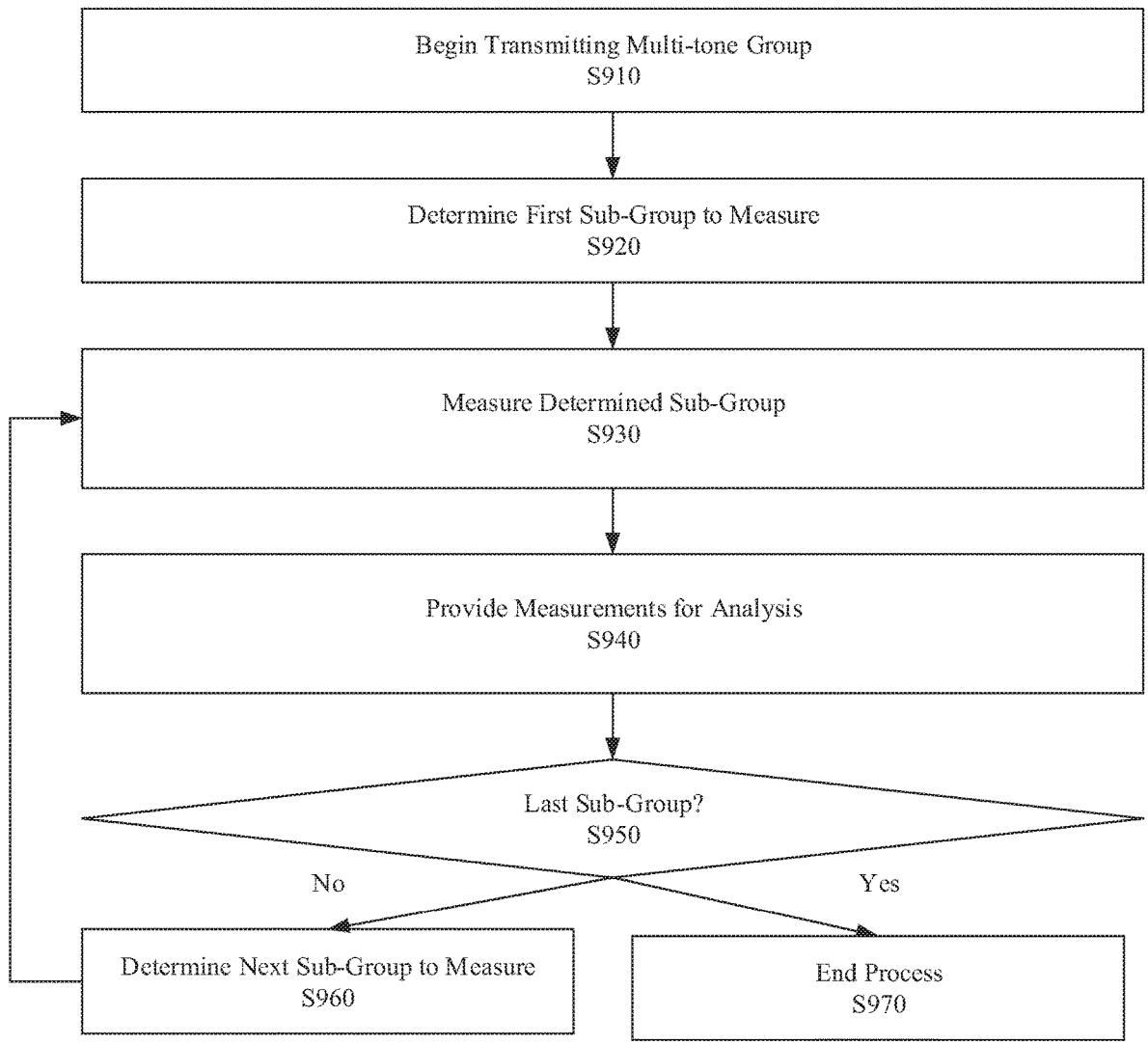
FIG. 9 illustrates another process for nonlinear distortion detection, in accordance with a representative embodiment.

FIG. 9 illustrates another process for nonlinear distortion detection, in accordance with a representative embodiment. In FIG. 9, the process begins by transmitting a multi-tone group at S910. At S920, the first subgroup of tones to measure is determined. At S930, the determined subgroup is measured. At S940, measurements of the determined subgroup of tones are provided for analysis. At S950, the process in FIG. 9 determines whether the subgroup for which measurements are provided at S940 is the last subgroup of tones to measure, and if yes (S950=Yes), the process ends at S970. If another subgroup of tones is to be measured (s 950=No), the next subgroup of tones to measure is determined at S960 and the process returns to S930.

That is, as shown in FIG. 9, when a multi-tone signal is repeatedly or continuously provided, a network analyzer 100 may process subgroups of individual tones. The subgroups may be predetermined. As examples, subgroups may include 25%, 20%, 10%, 5%, 4% or 2% of the total number of tones of a multi-tone signal. The subgroups may each include the same number of tones, substantially the same number of tones, or completely different numbers of tones. The tones in each subgroup may be spaced from one another on the frequency spectrum, such as by taking every fourth, every fifth, every tenth, every twentieth, every twenty-fifth, or every fiftieth tone of the multi-tone signal. When used, the spacing may be exact for all tones, or exact for most but not all tones. Additionally, the measured tones of a multi-tone signal in a subgroup may be substantially evenly spaced, even when the spacing on the frequency spectrum is not exact.

FIG. 10 illustrates power spectral density of $H(\omega)*(X_{ideal}(\omega)+\epsilon(\omega))$ and $|E(\omega)+0[\epsilon^2]|$ for nonlinear distortion detection, in accordance with a representative embodiment. In FIG. 10, the correlated part of the output signal is shown as $|H(\omega)(X_{ideal}(\omega)+\epsilon(\omega))|$ in the solid and continuous segments that define the two columns and the notch. The uncorrelated part of the output signal is shown as $E(\omega)+0[\epsilon^2]|$ in the dotted or dashed segments that form most of the basis of the shoulders and the filled portion of the notch. As shown, the power spectral density of the uncorrelated part is about 10 dB lower than the power spectral density of the correlated part.

FIG. 11 illustrates power spectral density of $|E(\omega)|$ and $|E(\omega)+0[\epsilon^2]|$ for nonlinear distortion detection, in accordance with a representative embodiment. In FIG. 11, the power spectral density of $E(\omega)$ is denoted by the solid and continuous segments, and the power spectral density of $E(\omega)+0[\epsilon^2]$ is denoted by the dotted or dashed segments. As shown, the two levels correspond well up to about −80 dB. Additionally, the output power spectral density in the channel in FIG. 11 is about 20 dBm/Hz. As shown, the two levels correspond well up to about −60 dB below which $E(\omega)+0[\epsilon^2]$ begins to form the outer portions of the shoulders seen in FIG. 10.

FIG. 12 illustrates details of power spectral density of $|E(\omega)|$ and $|E(\omega)+0[\epsilon^2]|$ for nonlinear distortion detection, in accordance with a representative embodiment. In FIG. 12, the power spectral density of $E(\omega)$ is denoted by the solid and continuous segments, and the power spectral density of $E(\omega)+0[\epsilon^2]$ is denoted by the dotted or dashed segments. The detail level for the channel shown in FIG. 12 shows a remarkably tight correspondence between $E(\omega))$ and $|E(\omega)+0[\epsilon^2]$ in the narrow channel that corresponds to the notch.

Figure 13:
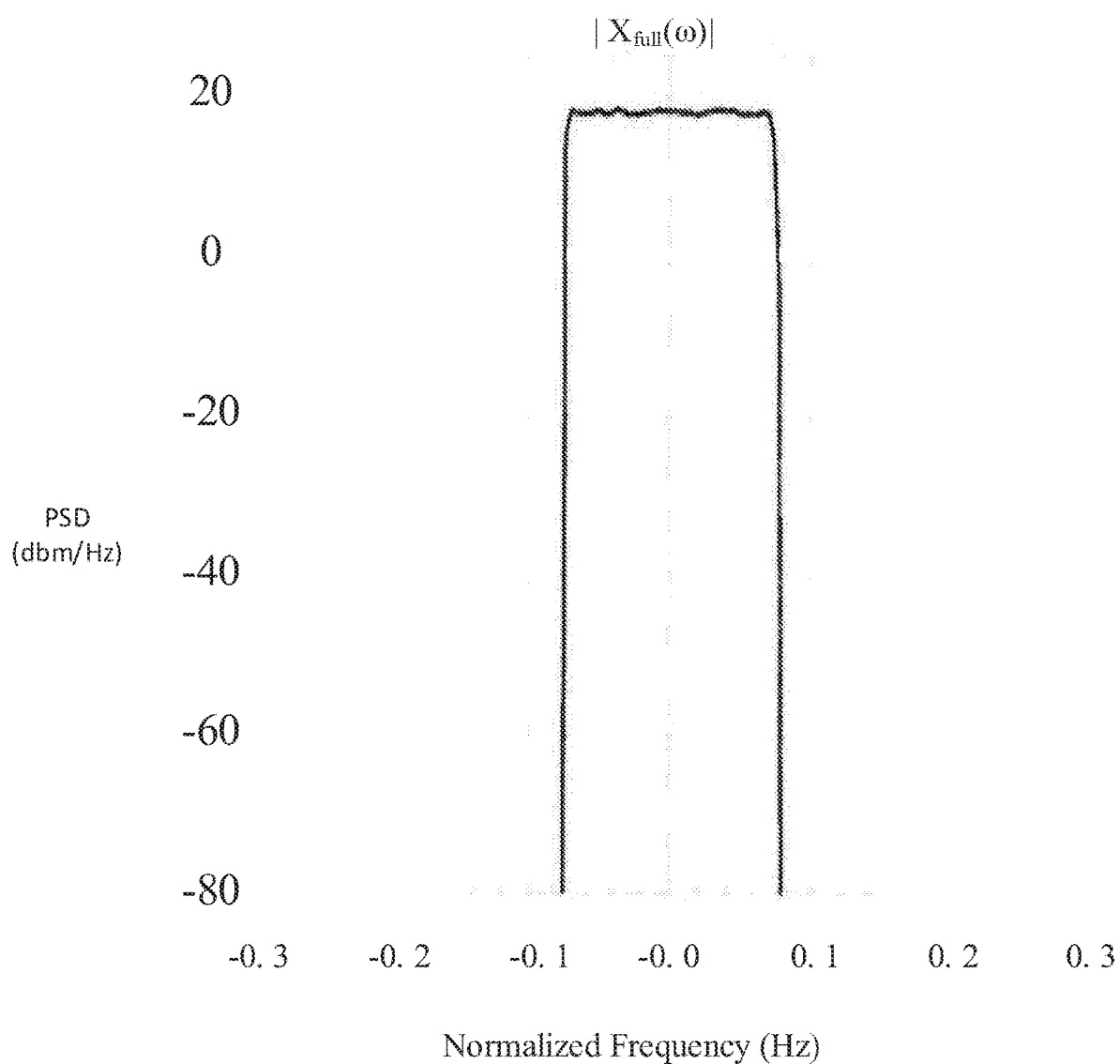
FIG. 13 illustrates power spectral density of $|X_{full}(\omega)|$ for nonlinear distortion detection, in accordance with a representative embodiment.

FIG. 13 illustrates power spectral density of $|(X_{full}(\omega)|$ for nonlinear distortion detection, in accordance with a representative embodiment. The processes described herein can be used to measure noise to power ratios without using a notch in the input signal. This is illustrated in FIG. 13 using simulated data similar to the data used previously. Here, a multi-tone input signal $X_{full}(\omega)$, which is similar to $X_{ideal}(\omega)$, but without the notch. The power spectral density of $X_{full}(\omega)$ is depicted in FIG. 13.

Figure 14:
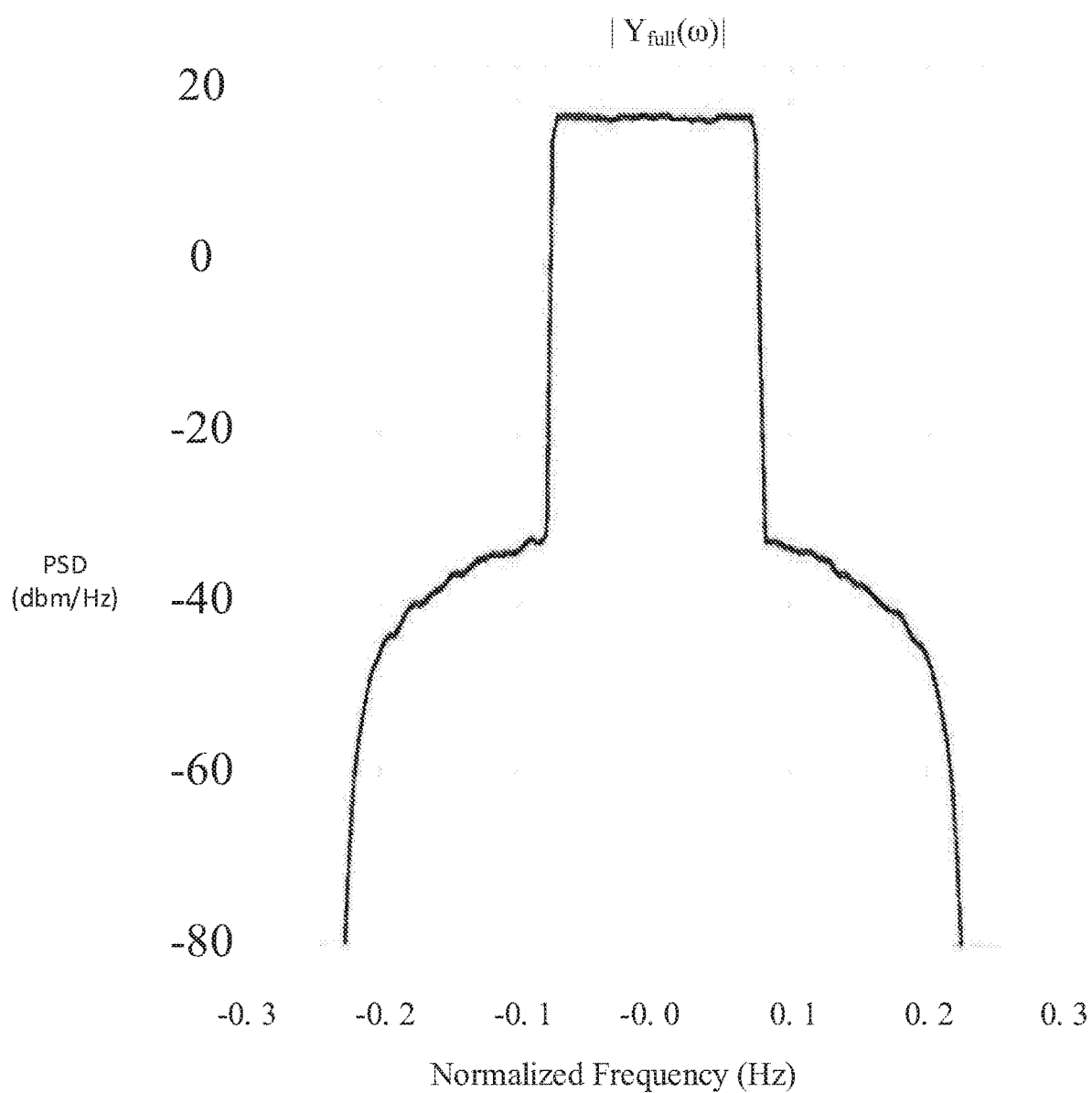
FIG. 14 illustrates power spectral density of $|Y_{full}(\omega)|$ for nonlinear distortion detection, in accordance with a representative embodiment.

FIG. 14 illustrates power spectral density of $|Y_{full}(\omega)|$ for nonlinear distortion detection, in accordance with a representative embodiment. Applying the same nonlinear distortion to signal $X_{full}(\omega)$ as the one used for FIG. 13 results in the output spectrum $Y_{full}(\omega)$, which is depicted in FIG. 10.

Figure 15:
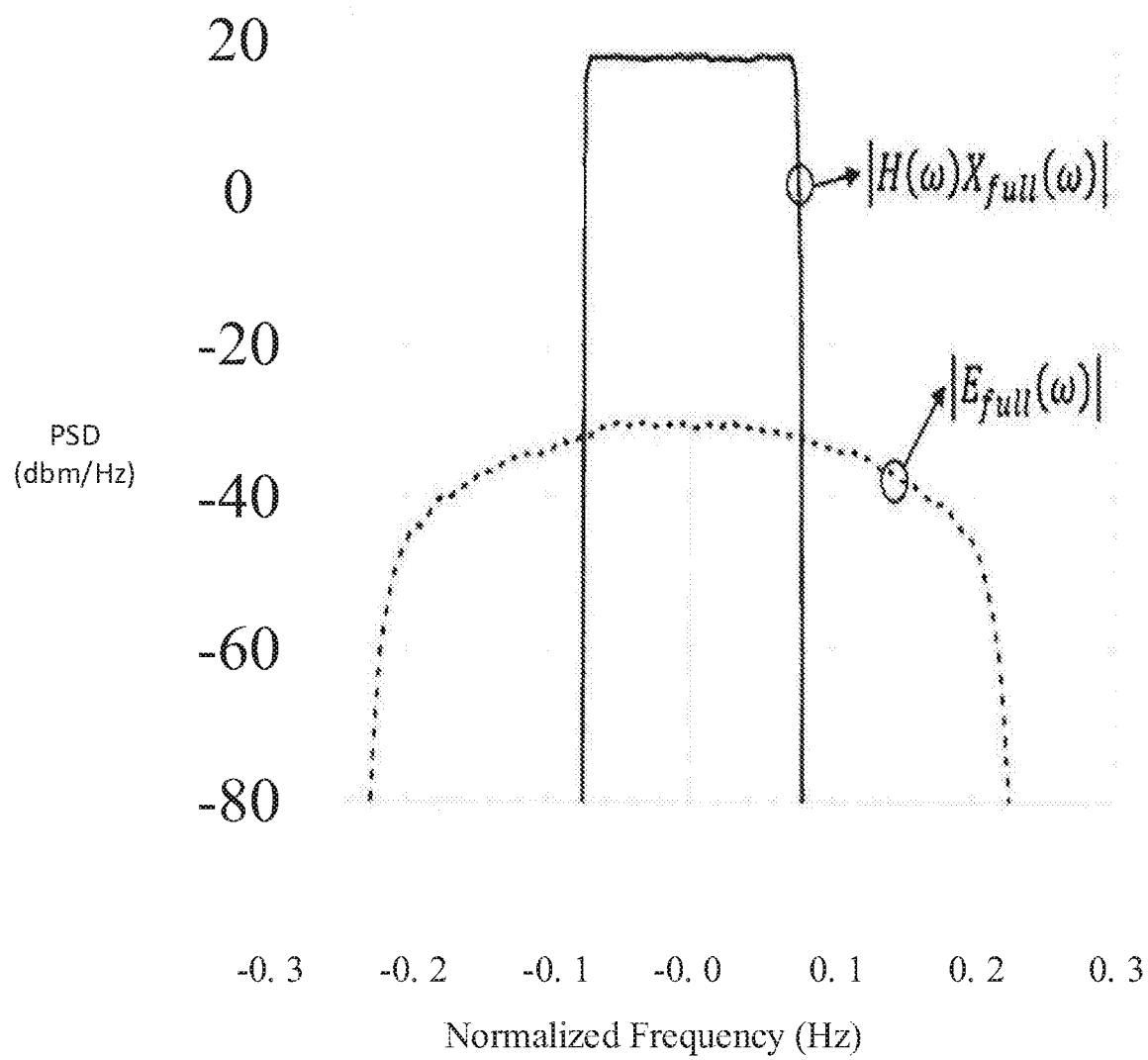
FIG. 15 illustrates power spectral density of $|H(\omega)X_{full}(\omega)|$ and $|E_{full}(\omega)|$ for nonlinear distortion detection, in accordance with a representative embodiment.

FIG. 15 illustrates power spectral density of $|H(\omega)X_{full}(\omega)|$ and $|E_{full}(\omega)|$ for nonlinear distortion detection, in accordance with a representative embodiment. In FIG. 15, the results of decomposing $Y_{full}(\omega)$ into the correlated part $H(\omega)X_{full}(\omega)$ and the uncorrelated part $E_{full}(\omega)$ are shown.

Figure 16:
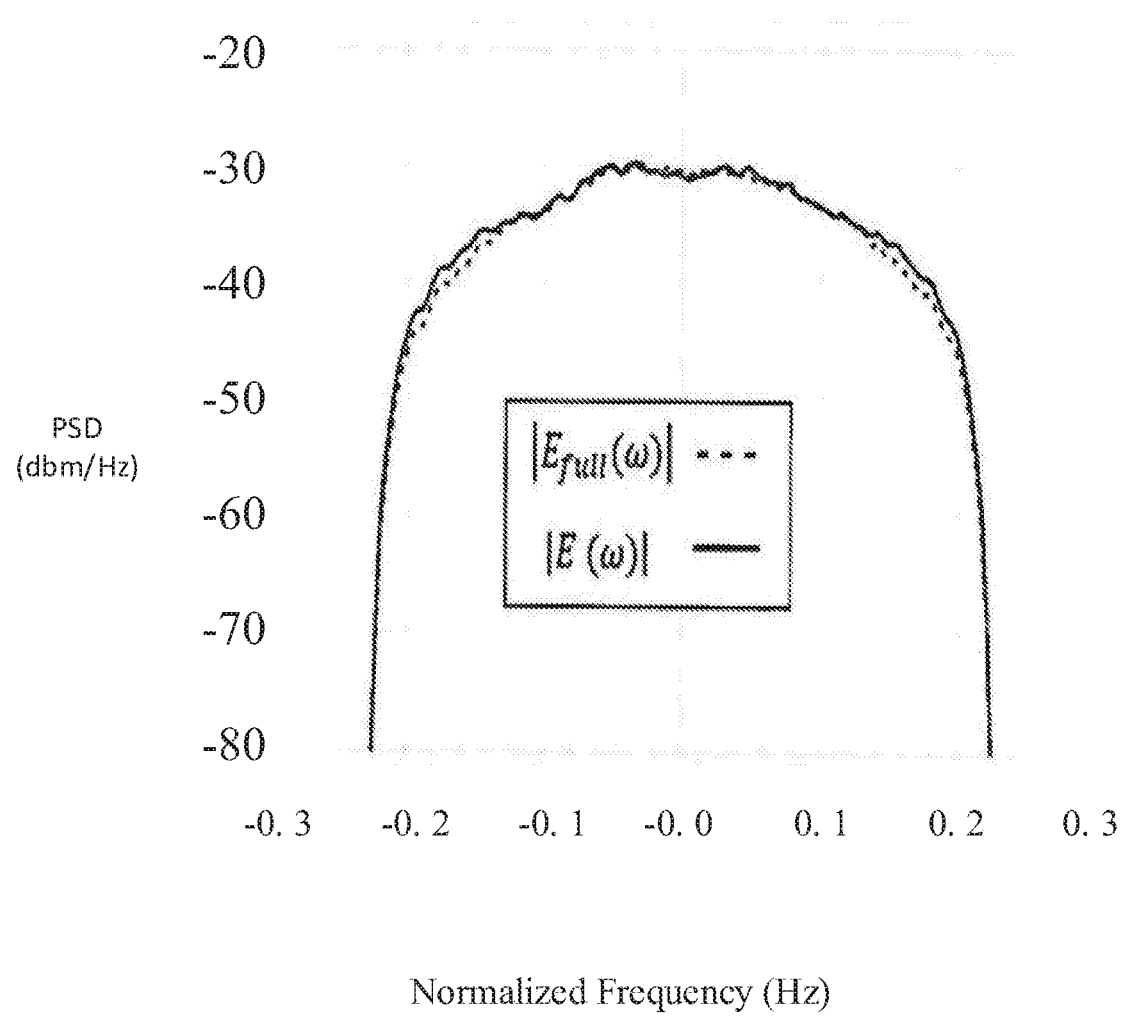
FIG. 16 illustrates power spectral density of $|E_{full}(\omega)|$ and $|E(\omega)|$ for nonlinear distortion detection, in accordance with a representative embodiment.
Figure 17:
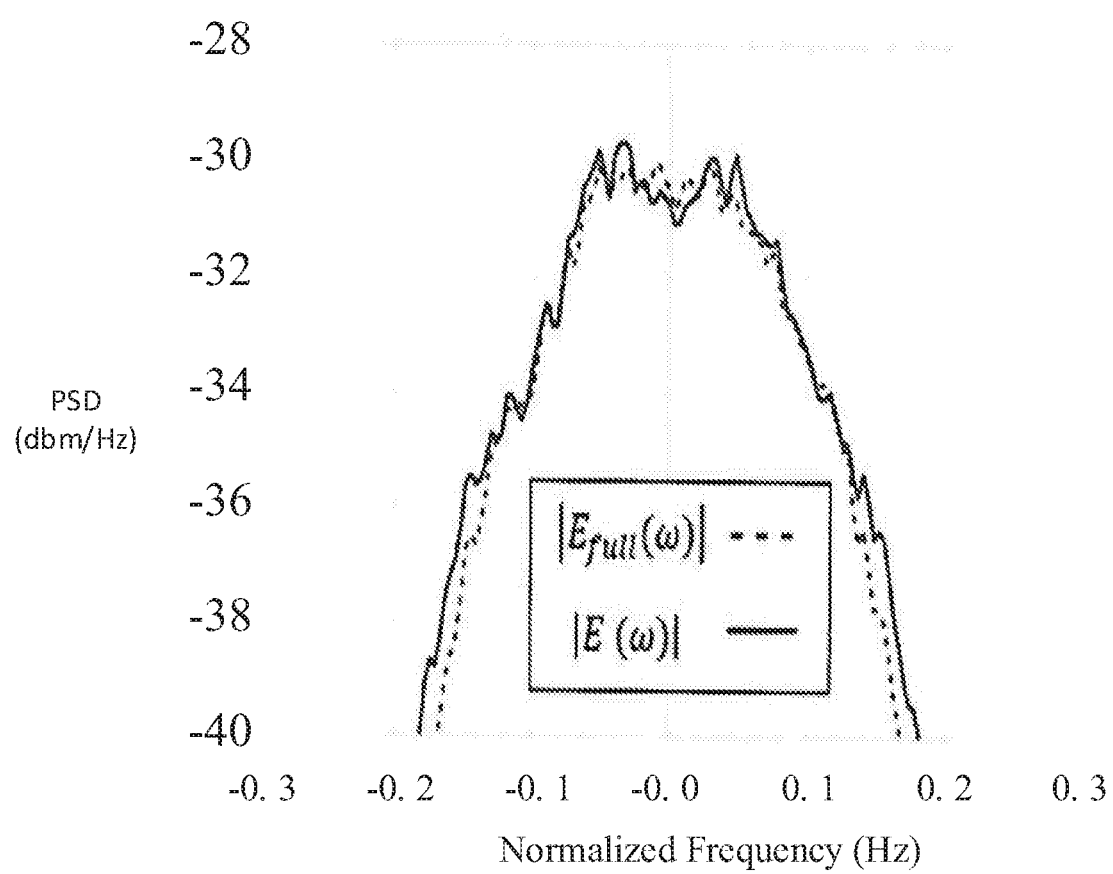
FIG. 17 illustrates details of power spectral density of $|E_{full}(\omega)|$ and $|E(\omega)|$ for nonlinear distortion detection, in accordance with a representative embodiment.

FIG. 16 illustrates power spectral density of $|E_{full}(\omega)|$ and $|E(\omega)|$ for nonlinear distortion detection, in accordance with a representative embodiment. FIG. 17 illustrates details of power spectral density of $|E_{full}(\omega)$ and $|E(\omega)|$ for nonlinear distortion detection, in accordance with a representative embodiment. The result of comparing $E_{full}(\omega)$ and the original $E(\omega)$ are shown in FIGS. 16 and 17. As can be seen, there is no significant different between the two nonlinear distortions. This illustrates that noise-power-ratios can be measured without having a notch in the input signal $X(\omega)$.

Accordingly, nonlinear distortion detection enables detection of nonlinear distortion specific to a DUT 105, without relying on an assumption as to the quality of an excitation input from a signal generator 101. Additionally, the nonlinear distortion detection can be performed without driving an input signal $X(\omega)$ from a signal generator 101 to zero (0) to create a notch. Nonlinear distortion detection also provides for determining a frequency response function $H(\omega)$ without relying on or referring to a particular communications standard, such that the determined frequency response function $H(\omega)$ is independent of any particular communications standard specific to an input signal. The ability to determine an accurate frequency response function $H(\omega)$ without assumptions and without referring to a communications standard also avoids a need to assume that the frequency response function is a predetermined constant regardless of the particulars of the DUT 105.

Among the other practical uses of nonlinear distortion detection, subsequent output of a signal generator 101 can be adjusted to compensate for nonlinear distortion expected in testing of a DUT 105. Additionally, DUTs 105 can be evaluated based on whether nonlinear distortion specific to any particular 105 is within a predetermined range relative to a standard set based on initial testing of DUTs 105 used as pilots in testing. In any event, nonlinear distortion detection provides for specifically identifying both a frequency response function and amounts of nonlinear distortion specific to a DUT, and reduce or eliminate reliance on assumptions such as that the quality of an input signal from a signal generator 101 is acceptable.

Although nonlinear distortion detection has been described with reference to several exemplary embodiments, it is understood that the words that have been used are words of description and illustration, rather than words of limitation. Changes may be made within the purview of the appended claims, as presently stated and as amended, without departing from the scope and spirit of nonlinear distortion detection in its aspects. Although nonlinear distortion detection has been described with reference to particular means, materials and embodiments, nonlinear distortion detection is not intended to be limited to the particulars disclosed; rather nonlinear distortion detection extends to all functionally equivalent structures, methods, and uses such as are within the scope of the appended claims.

For example, a DUT 105 is not restricted to the particular types of DUTs described herein, and may instead be any type of communications device that receives and processes a signal from signal generators such as signal generator 101. Similarly, though the embodiments described herein mainly rely on network analyzers for the processing described herein, as set forth with respect to FIG. 2, analysis for nonlinear distortion detection may be performed separately by a computer 111, or even in a third-party cloud computing environment.

Although the present specification describes components and functions that may be implemented in particular embodiments with reference to particular standards and protocols, the disclosure is not limited to such standards and protocols. For example, standards such as LTE or 5G represent examples of the state of the art. Such standards are periodically superseded by more efficient equivalents having essentially the same functions. Accordingly, replacement standards and protocols having the same or similar functions are considered equivalents thereof.

The illustrations of the embodiments described herein are intended to provide a general understanding of the structure of the various embodiments. The illustrations are not intended to serve as a complete description of all of the elements and features of the disclosure described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The preceding description of the disclosed embodiments is provided to enable any person skilled in the art to practice the concepts described in the present disclosure. As such, the above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

The invention claimed is:

1. A method for detecting nonlinear distortion of a device under test (DUT), comprising:
   obtaining measurements of a multi-tone input signal from a signal generator to a DUT, to obtain a measured multi-tone input signal;
   obtaining measurements of a multi-tone output signal from the DUT that is generated based on the multi-tone input signal, to obtain a measured multi-tone output signal; and
   determining, in the frequency domain and using a processor that executes a software program, a correlated part of the measured multi-tone output signal that is correlated with the measured multi-tone input signal and that corresponds to a frequency response function of the DUT;
   determining nonlinear distortion in the measured multi-tone output signal by removing the correlated part of the measured multi-tone output signal from the measured multi-tone output signal;
   selecting a parametric representation of a frequency response function of the DUT as a function of a priori unknown parameters;
   minimizing an error function versus the a priori unknown parameters for a specified frequency range to obtain an optimal parameter vector for the a priori unknown parameters; and
   estimating the nonlinear distortion by subtracting the frequency response function as a function of the optimal parameter vector applied to the measured input multi-tone signal from the measured multi-tone output signal.

2. The method of claim 1,
   wherein the determining is performed independent of modulation format, and
   the determining is insensitive to phase relationships between individual tones of the multi-tone input signal and the multi-tone output signal.

3. The method of claim 1,
   wherein the measurements of the multi-tone input signal and the measurements of the multi-tone output signal are obtained by a network analyzer, and
   the determining is performed by a computer with a processor and memory separate from the network analyzer.

4. The method of claim 1, further comprising:
   simulating, using the frequency response function and the nonlinear distortion, an idealized output of the DUT from an idealized input to the DUT; and
   identifying an error vector magnitude based on the idealized output.

5. The method of claim 1,
   wherein the multi-tone signal comprises a set of tones, and wherein the measured multi-tone input signal and the measured multi-tone output signal are measured based on a selected subgroup of the set of tones.

6. The method of claim 1,
   wherein the measurements of the multi-tone input signal comprise amplitude and phase of the multi-tone input signal at each of a plurality of frequencies corresponding to individual tones, and wherein the measurements of the multi-tone output signal comprise amplitude and phase of the multi-tone output signal at each of the plurality of frequencies corresponding to the individual tones.

7. The method of claim 1, further comprising:
adjusting subsequent multi-tone output signals from the signal generator based on determining the nonlinear distortion of the multi-tone output signal.

8. The method of claim 1,
wherein the multi-tone input signal is one of a plurality of multi-tone input signals for which measurements are obtained;
the multi-tone output signal is one of a plurality of multi-tone output signals for which measurements are obtained; and
the measured multi-tone output signals are decomposed into first components that are correlated with the measured multi-tone input signals and second components that are uncorrelated with the measured multi-tone input signals.

9. A system for detecting nonlinear distortion of a device under test (DUT), comprising:
a computer having a memory that stores instructions and a processor that executes the instructions, wherein, when executed by the processor, the instructions cause the computer to:
obtain measurements of a multi-tone input signal from a signal generator to a DUT, to obtain a measured multi-tone input signal;
obtain measurements of a multi-tone output signal from the DUT that is generated based on the multi-tone input signal, to obtain a measured multi-tone output signal; and
decompose, in the frequency domain and using a processor that executes a software program, the measured multi-tone output signal into a first component that is correlated with the measured multi-tone input signal and a second component that is uncorrelated with the measured multi-tone input signal
determine nonlinear distortion in the measured multi-tone output signal by removing the correlated part of the measured multi-tone output signal from the measured multi-tone output signal;
select a parametric representation of a frequency response function of the DUT as a function of a priori unknown parameters;
minimize an error function versus the a priori unknown parameters for a specified frequency range to obtain an optimal parameter vector for the a priori unknown parameters; and
estimate the nonlinear distortion by subtracting the frequency response function as a function of the optimal parameter vector applied to the measured input multi-tone signal from the measured multi-tone output signal.

10. The system of claim 9, wherein the non-linear distortion is determined independent of modulation format, and the determination is insensitive to phase relationships between individual tones of the multi-tone input signal and the multi-tone output signal.

11. The system of claim 9,
wherein the measurements of the multi-tone input signal and the measurements of the multi-tone output signal are obtained by a network analyzer.

12. The system of claim 9, wherein the instructions further cause the computer to:
simulate, using the frequency response function and the nonlinear distortion, an idealized output of the DUT from an idealized input to the DUT; and
identify an error vector magnitude based on the idealized output.

13. The system of claim 9,
wherein the multi-tone signal comprises a set of tones, and the measured multi-tone input signal and the measured multi-tone output signal are measured based on a selected subgroup of the set of tones.

14. The system of claim 9,
wherein the measurements of the multi-tone input signal comprise amplitude and phase measurements of the multi-tone input signal at each of a plurality of frequencies corresponding to individual tones, and the measurements of the multi-tone output signal comprise amplitude and phase of the multi-tone output signal at each of the plurality of frequencies corresponding to the individual tones.

15. The system of claim 9, wherein the instructions further cause the computer to:
adjust subsequent multi-tone output signals from the signal generator based on determining the nonlinear distortion of the multi-tone output signal.

16. The system of claim 9, wherein:
the multi-tone input signal is one of a plurality of multi-tone input signals for which measurements are obtained;
the multi-tone output signal is one of a plurality of multi-tone output signals for which measurements are obtained; and
the measured multi-tone output signals are decomposed into first components that are correlated with the measured multi-tone input signals and second components that are uncorrelated with the measured multi-tone input signals.

* * * * *